United States Patent
Suwa

(10) Patent No.: US 8,338,510 B2
(45) Date of Patent: Dec. 25, 2012

(54) PHOTOSENSITIVE SILOXANE COMPOSITION, CURED FILM FORMED THEREFROM AND DEVICE HAVING THE CURED FILM

(75) Inventor: Mitsuhito Suwa, Shiga (JP)

(73) Assignee: Toray Industries, Inc. (JP)

( * ) Notice: Subject to any disclaimer, the term of this patent is extended or adjusted under 35 U.S.C. 154(b) by 379 days.

(21) Appl. No.: 12/517,186

(22) PCT Filed: Nov. 21, 2007

(86) PCT No.: PCT/JP2007/072541
§ 371 (c)(1),
(2), (4) Date: Jan. 28, 2010

(87) PCT Pub. No.: WO2008/065944
PCT Pub. Date: Jun. 5, 2008

(65) Prior Publication Data
US 2010/0129618 A1    May 27, 2010

(30) Foreign Application Priority Data

Nov. 30, 2006 (JP) ................................. 2006-323302
Jun. 5, 2007 (JP) ................................. 2007-148924

(51) Int. Cl.
*C08K 5/00* (2006.01)
*B41M 5/00* (2006.01)
*C08F 2/50* (2006.01)
*C08F 283/04* (2006.01)
*C08G 69/08* (2006.01)
*C08G 63/18* (2006.01)

(52) U.S. Cl. ......... 524/87; 428/195.1; 522/36; 525/422; 528/305; 528/310

(58) Field of Classification Search .................... 524/87; 428/195.1; 522/36; 528/305, 310; 525/422, 525/426
See application file for complete search history.

(56) References Cited

U.S. PATENT DOCUMENTS 5,055,549 A * 10/1991 Maeda et al. .................. 528/310

FOREIGN PATENT DOCUMENTS

| | | |
|---|---|---|
| JP | 55-35077 | 3/1980 |
| JP | 05-001078 | 1/1993 |
| JP | 10-010740 | 1/1998 |
| JP | 11-258787 | 9/1999 |
| JP | 2007-163720 | 6/2007 |
| WO | WO 2005/040245 | * 5/2005 |

* cited by examiner

*Primary Examiner* — Timothy J. Kugel
*Assistant Examiner* — Atnaf Admasu
(74) *Attorney, Agent, or Firm* — Pillsbury Winthrop Shaw Pittman LLP; Raj S. Dave

(57) ABSTRACT

Various embodiments provide a photosensitive siloxane composition containing (a) polysiloxane, (b) a quinone diazide compound, (c) a solvent, and (d) one or more kinds of specified imidosilane compounds. Various embodiments also provide a cured film obtained by applying and/or patterning the photosensitive siloxane composition. Various embodiments further provide a device including the cured film.

5 Claims, No Drawings

PHOTOSENSITIVE SILOXANE COMPOSITION, CURED FILM FORMED THEREFROM AND DEVICE HAVING THE CURED FILM

TECHNICAL FIELD

The present invention relates to a photosensitive siloxane composition for forming a planarization film for a thin film transistor (TFT) substrate of a liquid crystal display device, an organic EL display device or the like, an interlayer insulation film of a semiconductor device, or a core or clad material of a light waveguide, a cured film formed therefrom and a device having the cured Film.

BACKGROUND ART

In recent years, for example, in liquid crystal displays and organic EL displays, a method for enhancing the aperture ratio of a display device is known as a method for achieving further higher precision and higher resolution (refer to Patent Document 1). This is a method in which a transparent heat-resistant planarization film is prepared on a TFT device to transmit light with more efficiency by applying a planarization material onto the TFT device formed on a substrate and thermally curing the material.

The materials used as the planarization films for TFT substrates are required to become highly heat resistant and highly transparent after curing, and as the materials having these characteristics, polysiloxane and silicone polyimide precursor are known (refer to Patent Documents 2, 3, 4).

Generally, when an organic compound is used for the planarization films for TFT substrates, its cured film had a problem that an adequate adhesiveness to a substrate surface or a device surface composed of metal or an inorganic substance is not achieved in addition to the problems of heat resistance and transparency. Therefore, a composition made by adding a silane coupling agent to a phenolic resin and a quinone diazide compound for improving the adhesiveness (refer to Patent Document 5), and a composition made by adding a silane coupling agent to an acrylic resin and a quinone diazide compound (refer to Patent Document 6) are known. In either technology, the silane coupling agent is added in order to improve adhesiveness to a substrate. However, when the silane coupling agent is added to polysiloxane for the same purpose, an adequate adhesiveness to a substrate surface or a device surface can be achieved without impairing high heat resistance and high transparency, but there is a problem that strains or cracks are generated depending on kinds of solvents used in a resist-stripping treatment by an alkaline solvent, which is performed to process an upper layer of a cured film after forming the cured film.

Further, it is known that the adhesiveness is improved by adding aromatic bisimide oligomer to polyimide (refer to Patent Document 7). However, since aromatic bisimide oligomer has absorption in a visible light region, the addition of the aromatic bisimide oligomer to polysiloxane enables to provide adequate adhesiveness to the substrate surface or the device surface and inhibit the occurrence of cracks due to an alkaline solvent, but it causes a problem of transparency.

On the other hand, a silicone polyimide precursor has an excellent adhesiveness to the substrate surface or the device surface and crack resistance against the alkaline solvent because it has a structure of a silane coupling agent at the end and a cured film formed from the silicone polyimide precursor has an imido bond, but the silicone polyimide precursor has large shrinkage during curing in its conversion to imido by heat because it has an amic acid structure and therefore it does not have sufficient planarization characteristics.

Patent Document 1: Japanese Patent Publication No. 2006-227649 (claim 1)

Patent Document 2: Japanese Patent Publication No. 2006-18249 (claim 1)

Patent Document 3: Japanese Patent Publication No. 8-259894 (claims 1, 2)

Patent Document 4: Japanese Patent Publication No. 9-291150 (claim 1)

Patent Document 5: Japanese Patent Publication No. 2003-43688 (p. 8)

Patent Document 6: Japanese Patent Publication No. 2005-49691 (p. 18)

Patent Document 7: Japanese Patent Publication No. 10-1542 (claim 1)

DISCLOSURE OF THE INVENTION

Problems to Solved by the Invention

The present invention has been made in view of such a situation, and it is an object of the present invention to provide a photosensitive siloxane composition which makes it possible to provide a cured film having low shrinkage during curing and high transparency after thermal curing, suppressing the occurrence of cracks due to an alkaline solvent and exhibiting excellent adhesiveness to a substrate.

It is also an object of the present invention to provide device materials, such as a heat-resistant insulation film, a planarization film for a TFT substrate, an interlayer insulation film, a core or clad material, and the like, which have the above-mentioned characteristics.

Means for Solving the Problems

That is, the present invention pertains to a photosensitive siloxane composition containing (a) polysiloxane, (b) a quinone diazide compound, (c) a solvent, and (d) one or more kinds of imidosilane compounds represented by the general formulas (1) to (3):

[Formula 1]

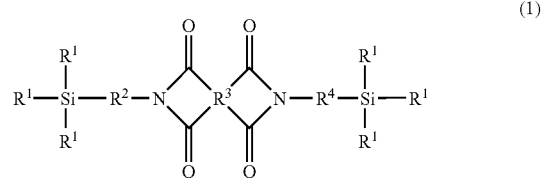

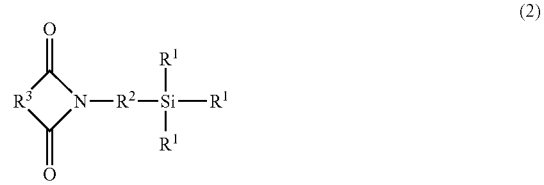

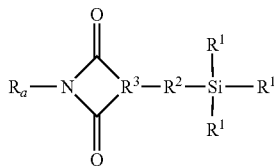

wherein R¹s may be the same or different and each represents an alkyl group having 1 to 6 carbon atoms, an alkoxy group having 1 to 6 carbon atoms, a phenyl group, a phenoxy group or an organic group replaced with them, $R^2$ and $R^4$ represent each a divalent organic group having 1 to 10 carbon atoms, $R^3$ represents an organic group not containing a silicon atom and having 2 to 20 carbon atoms (provided that $R^3$ represents an organic group other than a phenyl group in the general formula (1) and represents an organic group, not containing an unsaturated bond, other than an alicyclic group in the general formula (2)), and $R_a$ represents a hydrogen atom or an organic group not containing a silicon atom and having 1 to 20 carbon atoms.

Effects of the Invention

The composition of the present invention has high sensitivity and high resolution in forming patterns and makes it possible to form a cured film having high transparency, excellent solvent resistance and high adhesiveness to a substrate.

BEST MODE FOR CARRYING OUT THE INVENTION

The present invention pertains to a photosensitive siloxane composition containing (a) polysiloxane, (b) a quinone diazide compound, (c) a solvent, and (d) one or more kinds of imidosilane compounds represented by the general formulas (1) to (3):

[Formula 2]

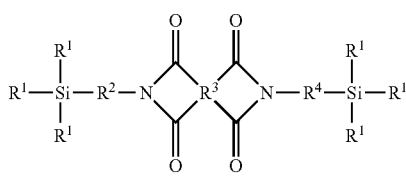

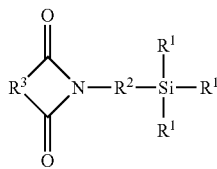

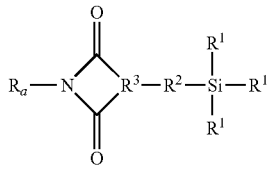

wherein R¹s may be the same or different and each represents an alkyl group having 1 to 6 carbon atoms, an alkoxy group having 1 to 6 carbon atoms, a phenyl group, a phenoxy group or an organic group replaced with them, $R^2$ and $R^4$ represent each a divalent organic group having 1 to 10 carbon atoms, $R^3$ represents an organic group not containing a silicon atom and having 2 to 20 carbon atoms (provided that $R^3$ represents an organic group other than a phenyl group in the general formula (1) and represents an organic group, not containing an unsaturated bond, other than an alicyclic group in the general formula (2)), and $R_a$ represents a hydrogen atom or an organic group not containing a silicon atom and having 1 to 20 carbon atoms.

A structure of (a) polysiloxane used in the present invention is not particularly limited, but preferable aspects of the polysiloxane include polysiloxane obtained by mixing and reacting one or more kinds of organosilanes represented by the general formula (4):

[Formula 3]

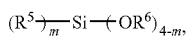

wherein R⁵s represent any of hydrogen, an alkyl group having 1 to 10 carbon atoms, an alkenyl group having 2 to 10 carbon atoms and an aryl group having 6 to 15 carbon atoms and plural $R^5$ may be the same or different, R⁵s represent any of hydrogen, an alkyl group having 1 to 6 carbon atoms, an acyl group having 1 to 6 carbon atoms and an aryl group having 6 to 15 carbon atoms and plural $R^5$ may be the same or different, and m represents an integer of zero to 3.

The alkyl group, the alkenyl group and the aryl group represented by $R^5$ in the general formula (4) all may have a substituent or may be an unsubstituted group not having a substituent, and these can be selected according to a characteristic of the composition. Specific examples of the alkyl group include a methyl group, an ethyl group, an n-propyl group, an isopropyl group, an n-butyl group, a t-butyl group, an n-hexyl group, an n-decyl group, a trifluoromethyl group, a 2,2,2-trifluoroethyl group, a 3,3,3-trifluoropropyl group, a 3-glycidoxypropyl group, 2-(3, 4-epoxycyclohexyl)ethyl group, a 3-aminopropyl group, a 3-mercaptopropyl group, and a 3-isocyanatepropyl group. Specific examples of the alkenyl group include a vinyl group, 3-acryloxypropyl group and 3-methacryloxypropyl group. Specific examples of the aryl group include a phenyl group, a tolyl group, a p-hydroxyphenyl group, 1-(p-hydroxyphenyl)ethyl group, a 2-(p-hydroxyphenyl)ethyl group, 4-hydroxy-5-(p-hydroxyphenylcarbonyloxy)pentyl group and naphthyl group.

The alkyl group and the acyl group represented by $R^6$ in the general formula (4) all may have a substituent or may be an unsubstituted group not having a substituent, and these can be selected according to a characteristic of the composition. Specific examples of the alkyl group include a methyl group, an ethyl group, an n-propyl group, an isopropyl group, and an n-butyl group. Specific examples of the acyl group include an acetyl group. Specific examples of the aryl group include a phenyl group.

In the general formula (4), m represents an integer of 0 to 3. If m is 0, the formula represents a tetrafunctional silane, and if m is 1, the formula represents a trifunctional silane, and if m is 2, the formula represents a difunctional silane, and if m is 3, the formula represents a monofunctional silane.

Examples of the organosilanes represented by the general formula (4) include tetrafunctional silanes such as tetramethoxysilane, tetraethoxysilane, tetraacetoxysilane and tetraphenoxysilane; trifunctional silanes such as methyltrimethoxysilane, methyltriethoxysilane, methyltriisopropoxysilane, methyl tri-n-buthoxy silane, ethyltrimethoxysilane, ethyltriethoxysilane, ethyltriisopropoxysilane, ethyl tri-n-buthoxy silane, n-propyltrimethoxysilane, n-propyltriethoxysilane, n-butyltrimethoxysilane, n-butyltriethoxysilane, n-hexyltrimethoxysilane, n-hexyltriethoxysilane, decyltrimethoxysilane, vinyltrimethoxysilane, vinyltriethoxysilane, 3-methacryloxypropyltrimethoxysilane, 3-methacryloxypropyltriethoxysilane, 3-acryloxypropyltrimethoxysilane, phenyltrimethoxysilane, phenyltriethoxysilane, p-hydroxyphenyltrimethoxysilane, 1-(p-hydroxyphenyl)ethyltrimethoxysilane, 2-(p-hydroxyphenyl)ethyltrimethoxysilane, 4-hydroxy-5-(p-hydroxyphenylcarbonyloxy)pentyltrimethoxysilane, trifluoromethyltrimethoxysilane, trifluoromethyltriethoxysilane, 3,3,3-trifluoropropyltrimethoxysilane, 3-aminopropyltrimethoxysilane, 3-aminopropyltriethoxysilane, 3-glycidoxypropyltrimethoxysilane, 3-glycidoxypropyltriethoxysilane, 2-(3,4-epoxycyclohexyl)ethyltrimethoxysilane and 3-mercaptopropyltrimethoxysilane; difunctional silanes such as dimethyldimethoxysilane, dimethyldiethoxysilane, dimethyldiacetoxysilane, di-n-butyldimethoxysilane and diphenyldimethoxysilane; and monofunctional silanes such as trimethylmethoxysilane and tri-n-butylethoxysilane.

Among these organosilanes, a trifunctional silane is preferably used in view of the crack resistance and hardness of a cured film. Further, these organosilanes may be used singly or may be used in combination of two or more species.

As (a) polysiloxane of the present invention, polysiloxane formed by copolymerizing silica particles maybe used. Examples of a method of copolymerizing silica particles include a method in which polysiloxane synthesized from the above-mentioned organosilane is reacted with silica particles, and a method in which the above-mentioned organosilane is reacted with silica particles to obtain polysiloxane. The silica particles are incorporated into the polysiloxane and at least a part of the polysiloxane is chemically coupled with the silica particles (coupled with the silica particles by a covalent bond), and thereby, the fluidity of the polysiloxane is lowered, sagging in patters during thermal curing is inhibited, and the resolution of patterns after thermal curing is improved.

In the method in which polysiloxane is reacted with silica particles, the silica particles are contained in the composition as an independent component, but they are incorporated into the polysiloxane by heating during pre-baking or curing.

A number average particle diameter of the silica particle to be used is preferably 2 to 200 nm, and more preferably 5 to 70 nm. When the number average particle diameter is smaller than 2 nm, an improvement in the resolution of patterns is not sufficient, and when the particle diameter is larger than 200 nm, the resulting cured film scatters light and the transparency of the cured film is deteriorated. Herein, as for the number average particle diameter of the silica particle, in a specific surface area method, the silica particles are dried and fired, specific surface areas of the resulting particles are measured, and then particle diameters are derived from the specific surface areas assumed that the particles are spherical to determine an average particle diameter in terms of a number average value. Equipment used for measuring the average particle diameter is not particularly limited, and for example, ASAP 2020 (manufactured by Micromeritics Instrument Corp.) can be employed.

The silica particles are obtained by a method of hydrolyzing and polycondensating one or more kinds of alkoxy silanes in the presence of water, an organic solvent and a base (preferably ammonia). The silica particles dispersed in the organic solvent is obtained by replacing water, which is a dispersion medium of the water-based silica particle, with the organic solvent. Examples of a method of replacing the dispersion medium include a method in which an organic solvent is added to water-based silica particles and water is distilled off by way of distillation, and the like. There may be cases where a part of the surface of the silica particle is esterified by addition of lower alcohol depending on the species of the solvent. The silica particle dispersed in the organic solvent is preferable from the viewpoint of compatibility with the polysiloxane or the quinone diazide compound.

Specific examples of the silica particles include IPA-ST using isopropanol as a dispersion medium and having a particle diameter of 12 nm, MIBK-ST using methyl isobutyl ketone as a dispersion medium and having a particle diameter of 12 nm, IPA-ST-L using isopropanol as a dispersion medium and having a particle diameter of 45 nm, IPA-ST-ZL using isopropanol as a dispersion medium and having a particle diameter of 100 nm, PGM-ST using propylene glycol monomethyl ether as a dispersion medium and having a particle diameter of 15 nm (these are trade names, manufactured by Nissan Chemical Industries, Ltd.), OSCAL 101 using gamma-butyrolactone as a dispersion medium and having a particle diameter of 12 nm, OSCAL 105 using gamma-butyrolactone as a dispersion medium and having a particle diameter of 60 nm, OSCAL 106 using diacetone alcohol as a dispersion medium and having a particle diameter of 120 nm, CATALOID-S using water as a dispersion medium and having a particle diameter of 5 to 80 nm (these are trade names, manufactured by Catalysts & Chemicals Ind. Co., Ltd.), Quartron PL-2L-PGME using propylene glycol monomethyl ether as a dispersion medium and having a particle diameter of 16 nm, Quartron PL-2L-BL using gamma-butyrolactone as a dispersion medium and having a particle diameter of 17 nm, Quartron PL-2L-DAA using diacetone alcohol as a dispersion medium and having a particle diameter of 17 nm, Quartron PL-2L and GP-2L using water as a dispersion medium and having a particle diameter of 18 to 20 nm (these are trade names, manufactured by FUSO CHEMICAL CO., LTD.), Silica ($SiO_2$) SG-SO 100 having a particle diameter of 100 nm (trade name, manufactured by KCM Corp.), and REOLOSIL having a particle diameter of 5 to 50 nm (trade name, manufactured by Tokuyama Corp.). Further, these silica particles may be may be used alone or in combination of two or more species.

It is preferable the surface of the silica particle used have a reactive group since the coupling of the polysiloxane with the silica particles becomes easy and film strength is enhanced. Examples of the reactive group include hydroxyl groups such as silanol, alcohol and phenol, vinyl groups, acrylic groups, ethynyl groups, epoxy groups and amino groups. By reacting the silica particle with alkoxy silane having a reactive group, the silica particle having a reactive group at the surface can be obtained. As a matter of course, the silica particle having a substituent not having the reactive group such as a methyl group, a phenyl group or the like may be used as long as it does not impair the effect of the present invention.

In the case where the silica particle is used, a mixing ratio of the silica particle to the polysiloxane is not particularly limited, but it is preferably 1 to 50% in terms of the ratio of the number of Si atom-moles of the silica particle to the number of Si atom-moles of the whole polymer. When this ratio is more than 50%, the compatibility between the polysiloxane and the quinone diazide compound is deteriorated and the transparency of a cured film is deteriorated.

The ratio of the number of Si atom-moles of the silica particle to the number of Si atom-moles of the whole polymer can be determined by calculating a ratio of a value of integral of a peak of Si—C bond to a value of integral of a peak of Si—O bond in IR. When this ratio cannot be determined because the overlap of the peaks is large, it can be determined by determining a structure of the monomer other than the particles by $^1$H-NMR, $^{13}$C-NMR, IR, TOF-MS or the like and analyzing the proportion between a gas generated and ash remaining (assumed that all ash is $SiO_2$) in an elemental analysis method.

From the viewpoint of achieving compatibility between crack resistance and hardness of the film in polysiloxane, the content of the phenyl group in the polysiloxane is preferably 20 to 70 mol % with respect to the amount of Si atoms, and more preferably 35 to 55 mol %. When the content of the phenyl group is more than 70 mol %, the hardness of the film is lowered, and when the content of the phenyl group is less than 20 mol %, the crack resistance is deteriorated. The content of the phenyl group can be determined, for example, by measuring a $^{29}$Si-nuclear magnetic resonance spectrum of polysiloxane and calculating a ratio of the peak area of Si having a phenyl group bonded to the peak area of Si having no phenyl group bonded.

The weight average molecular weight (Mw) of the polysiloxane used in the present invention is not particularly limited, but it is preferably 1000 to 100000 on the polystyrene equivalent basis measured by GPC (gel permeation chromatography), and more preferably 2000 to 50000. When the Mw is smaller than 1000, the coatability of the composition becomes poor, and when it is larger than 100000, the solubility of the composition in a developer during patterning is deteriorated. Polysiloxane which is soluble in an aqueous alkaline solution is preferably 2000 to 50000, and the weight average molecular weight of the polysiloxane is preferably 5000 to 100000. When the Mw is smaller than 5000, a temperature at which sagging in patterning due to heat occurs may be lowered.

The phrase "at least a part of the polysiloxane is chemically coupled with the silica particles (coupled with the silica particles by a covalent bond)", described above, means that reaction occurs between silica components in the silica particles and a part of the polysiloxane of a matrix, and the silica particles are incorporated at a fixed density into the polysiloxane. This state can be verified by observing a boundary zone between the silica particle and the polysiloxane with a transmission electron microscope (hereinafter, abbreviated as TEM). When the silica particles are chemically coupled with at least a part of the polysiloxane, a boundary line between the silica particle and the polysiloxane is not observed by a TEM observation.

A system, in which the silica particles are chemically coupled with at least a part of the polysiloxane, is more preferable than a system in which the same amount of silica particles are added to the polysiloxane in that this system not only prevents the precipitation of silica particles from a pre-baked film during development, but also lowers the fluidity of the polysiloxane, inhibits sagging in patters during thermal curing, and improves the resolution of patterns after thermal curing.

Polysiloxane in the present invention is obtained by hydrolyzing and partially condensing the above-mentioned organosilane. A common method can be used for the hydrolysis and partial condensation. For example, a solvent, water, and a catalyst as required are added to a mixture, and the obtained mixture is heated and stirred. During stirring, as required, the hydrolysis by-product (alcohols such as methanol) and condensation by-product (water) may also be distilled off.

AS for a production method of the polysiloxane in the case of coupling the polysiloxane with silica particles, the polysiloxane is obtained by a method in which a solvent and water, and a catalyst as required are added to the organosilane to hydrolyze the organosilane, and the silica particles and the hydrolyzed organosilane are partially condensed. The silica particles may coexist with the organosilane from start, or the silica particles maybe added after hydrolyzing and polymerizing the organosilane to form polysiloxane and the resulting mixture may be further heated, but a method, in which the silica particles are added dropwise immediately after hydrolyzing the organosilane, is preferable from the viewpoint of compatibility.

The reaction solvent is not particularly limited but a solvent similar to (c) a solvent described later is commonly used. An additive amount of the solvent is preferably 10 to 1000% by weight with respect to 100% by weight of organosilane or 100% by weight of a total amount of organosilane and silica particles. An additive amount of water to be used for a hydrolysis reaction is preferably 0.5 to 2 moles with respect to 1 mole of a hydrolyzable group.

The catalyst added as required is not particularly limited but an acid catalyst and a basic catalyst are preferably used. Specific examples of the acid catalysts include hydrochloric acid, nitric acid, sulfuric acid, hydrofluoric acid, phosphoric acid, acetic acid, trifluoroacetic acid, formic acid, polyhydric carboxylic acid or anhydride thereof, and an ion-exchange resin. Specific examples of the basic catalyst include triethylamine, tripropylamine, tributylamine, tripentylamine, trihexylamine, triheptylamine, trioctylamine, diethylamine, triethanolamine, diethanolamine, sodium hydroxide, potassium hydroxide, alkoxy silane having an amino group and an ion-exchange resin. An additive amount of the catalyst is preferably 0.01 to 10% by weight with respect to 100% by weight of organosilane.

In view of the coatability and the storage stability of the composition, it is preferable that a polysiloxane solution obtained after hydrolysis and partial condensation do not contain alcohol of a by-product, water, and the catalyst. These alcohol, water and catalyst may be removed as required. A method for removing these is not particularly limited. As the method for removing alcohol or water, a method, in which the polysiloxane solution is diluted with an adequate hydrophobic solvent and is washed with water several times and the resulting organic layer is concentrated using an evaporator, can be preferably employed. Further, as the method for removing catalyst, a method of treating the catalyst with an ion-exchange resin in addition to the above washing with water, or a method of only treating with the ion-exchange resin can be employed.

The photosensitive siloxane composition of the present invention contains (b) a quinone diazide compound. The photosensitive siloxane composition containing the quinone diazide compound forms a positive type in which an exposed portion is removed by a developer. An additive amount of the quinone diazide compound to be used is not particularly limited but it is preferably 3 to 30% by weight with respect to (a) polysiloxane. The additive amount is more preferably 4 to 20% by weight. When the additive amount of the quinone diazide compound is less than 3% by weight, the photosensitive siloxane composition does not have realistic photosensitivity because of too low dissolution contrast between an exposed area and an unexposed area. The additive amount of the quinone diazide compound is preferably 4% by weight or more in order to attain a more excellent dissolution contrast. On the other hand, when the additive amount of the quinone diazide compound is more than 30% by weight, a transparent and colorless property of a cured film is deteriorated since a coated film is whitened because of deteriorated compatibility between the polysiloxane and the quinone diazide compound or coloring due to the decomposition of the quinone diazide compound occurring during thermal curing becomes remarkable.

The quinone diazide compound to be used is not particularly limited, but it is preferably a compound having naphthoquinonediazidesulfonate-bonded to a compound having a phenolic hydroxyl group, and a compound, in which the ortho-position and the para-position of the phenolic hydroxyl group are, respectively independently, occupied by a hydrogen atom or a substituent group represented by the general formula (5), is used as the quinone diazide compound.

[Formula 4]

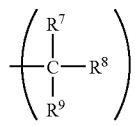

(5)

In the above formula, $R^7$ to $R^9$ independently represent any of an alkyl group having 1 to 10 carbon atoms, a carboxyl group, a phenyl group and a substituted phenyl group. Further, $R^7$ and $R^8$, $R^7$ and $R^9$, or $R^8$ and $R^9$ may form a ring.

In the substituent represented by the general formula (5), $R^7$ to $R^9$ independently represent any of an alkyl group having 1 to 10 carbon atoms, a carboxyl group, a phenyl group and a substituted phenyl group. The alkyl group may have a substituent or may be an unsubstituted group not having a substituent, and these can be selected according to a characteristic of the composition. Specific examples of the alkyl group include a methyl group, an ethyl group, an n-propyl group, an isopropyl group, an n-butyl group, an isobutyl group, a t-butyl group, an n-hexyl group, a cyclohexyl group, an n-heptyl group, an n-octyl group, a trifluoromethyl group and a 2-carboxyethyl group. Further, examples of a substituent with which the phenyl group is replaced include a hydroxyl group. Further, $R^7$ and $R^8$, $R^7$ and $R^9$, or $R^8$ and $R^9$ may form a ring, and specific examples of the ring include a cyclopentane ring, a cyclohexane ring, an adamantine ring, and a fluorene ring.

When each group at the ortho position and the para position of the phenolic hydroxyl group is other than the above groups, for example, a methyl group, thermal curing causes oxidative decomposition, and a conjugated compound typified by a quinoid structure is formed to color the cured film, thus lowering the transparent and colorless property. These quinone diazide compounds can be synthesized by a publicly known esterification reaction of the compound having a phenolic hydroxyl group with naphthoquinonediazidesulfonic acid chloride.

Specific examples of the compound having a phenolic hydroxyl group include the following compounds (trade names, manufactured by Honshu Chemical Industry Co., Ltd.).

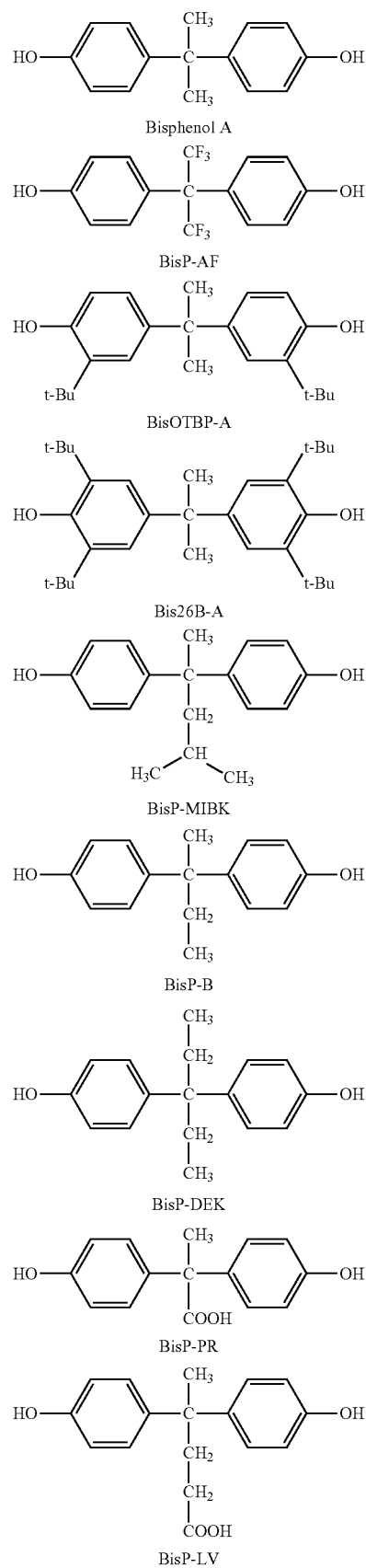

[Formula 5]

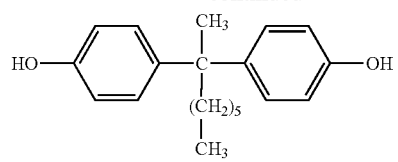
BisP-OT
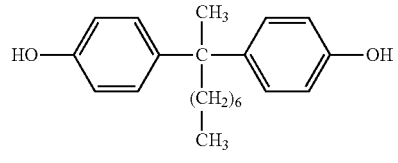
BisP-NO
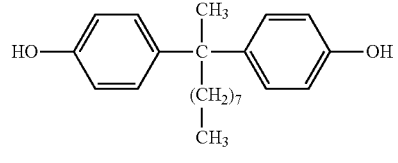
BisP-DE
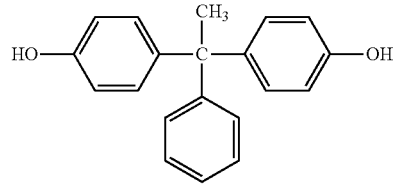
BisP-AP
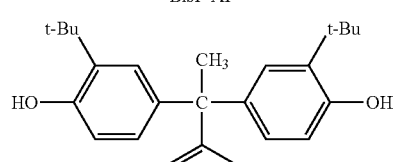
BisOTBP-AP
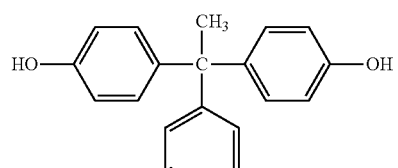
TrisP-HAP
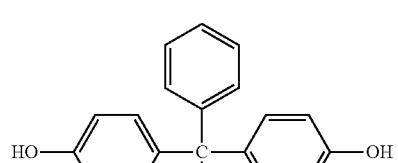
BisP-DP
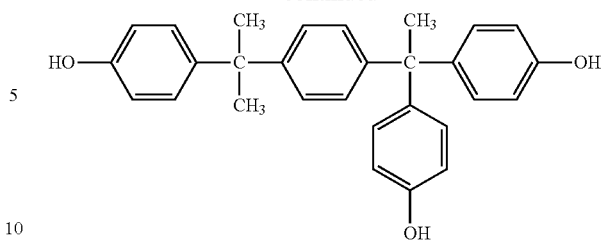
TrisP-PA
[Formula 6]
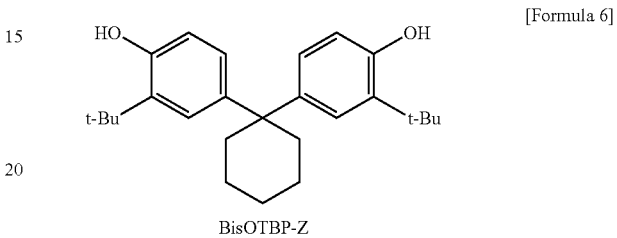
BisOTBP-Z
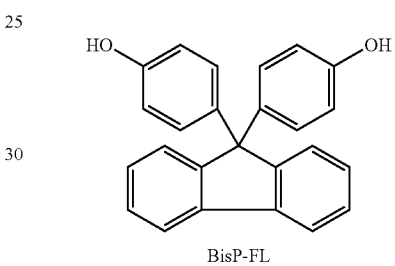
BisP-FL
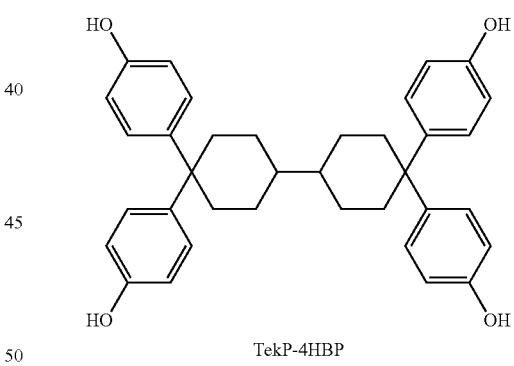
TekP-4HBP
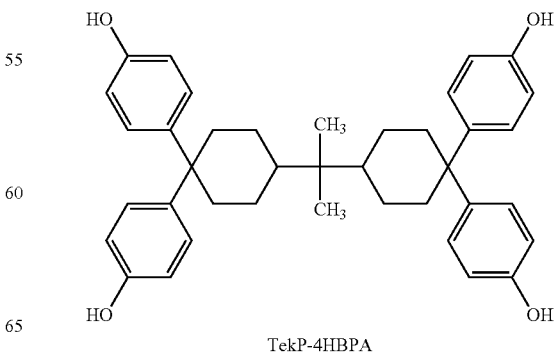
TekP-4HBPA -continued

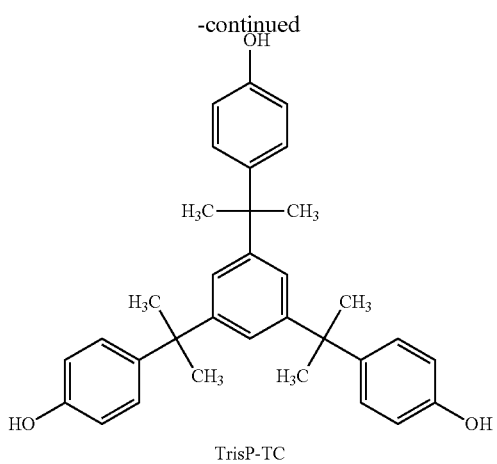

TrisP-TC

As the naphthoquinonediazidesulfonic acid, 4-naphthoquinonediazidesulfonic acid or 5-naphthoquinonediazidesulfonic acid can be employed. A 4-naphthoquinonediazidesulfonate compound is suitable for i-beam exposure since it has an absorption band of light in i-beam (wavelength 365 nm) region. Furthermore, a 5-naphthoquinonediazidesulfonic ester compound is suitable for exposure in a wide range of wavelengths since it has an absorption band of light in a wide range of wavelength region. It is preferred to select the 4-naphthoquinonediazidesulfonnate compound or the 5-naphthoquinonediazidesulfonnate compound, depending on the wavelength used for exposure. A mixture of the 4-naphthoquinonediazidesulfonate compound and the 5-naphthoquinonediazidesulfonate compound can also be used.

A molecular weight of the naphthoquinone diazide compound is preferably 300 to 1500, and more preferably 350 to 1200 . When the molecular weight of the naphthoquinone diazide compound is larger than 1500, there is a possibility that a pattern cannot be formed by 4 to 10% by weight of an additive amount of the compound. On the other hand, when the molecular weight of the naphthoquinone diazide compound is smaller than 300, the transparent and colorless property of the cured film may be deteriorated.

The photosensitive siloxane composition of the present invention contains (c) a solvent. The solvent is not particularly limited but compounds having an alcoholic hydroxyl group and/or cyclic compounds having a carbonyl group are preferably used. When these solvents are used, polysiloxane and the quinone diazide compound are uniformly dissolved, and even after the composition is applied to form a film, the film can achieve high transparency without being whitened.

The compounds having an alcoholic hydroxyl group are not particularly limited but they are preferably compounds having a boiling point of 110 to 250° C. under an atmospheric pressure. When this boiling point is higher than 250° C., an amount of a solvent remaining in the film increases and film shrinkage in thermally curing the film increases, and good flatness is not achieved. On the other hand, when the boiling point is lower than 110° C., because drying in coating is too fast, coatability is deteriorated, for example, a film surface is roughened.

Specific examples of the compounds having an alcoholic hydroxyl group include acetol, 3-hydroxy-3-methyl-2-butanone, 4-hydroxy-3-methyl-2-butanone, 5-hydroxy-2-pentanone, 4-hydroxy-4-methyl-2-pentanone (diacetone alcohol), ethyl lactate, butyl lactate, propylene glycol monomethyl ether, propylene glycol monoethyl ether, propylene glycol mono-n-propyl ether, propylene glycol mono-n-butyl ether, propylene glycol mono-t-butyl ether, 3-methoxy-1-butanol, and 3-methyl-3-methoxy-1-butanol. Among these compounds, compounds further having a carbonyl group are preferable and diacetone alcohol is particularly preferably used. These compounds having an alcoholic hydroxyl group maybe used alone or may be used in combination of two or more species.

The cyclic compounds having a carbonyl group are not particularly limited, but these are preferably compounds having a boiling point of 150 to 250° C. under an atmospheric pressure. When this boiling point is higher than 250° C., an amount of a solvent remaining in the film increases and film shrinkage in thermally curing the film increases, and good flatness is not achieved. On the other hand, when the boiling point is lower than 150° C., because drying in coating is too fast, coatability is deteriorated, for example, a film surface is roughened.

Specific examples of the cyclic compounds having a carbonyl group include gamma-butyrolactone, gamma-valerolactone, delta-valerolactone, propylene carbonate, N-methylpyrrolidone, cyclohexanone, and cycloheptanone. Among these compounds, particularly, gamma-butyrolactone is preferably used. These cyclic compounds having a carbonyl group may be used alone or may be used in combination of two or more species.

The compounds having an alcoholic hydroxyl group and the cyclic compounds having a carbonyl group, described above, may be used singly, or may be used as a mixture thereof. In the case where both the compounds are used as a mixture, a weight ratio between both the compounds is not particularly limited, but the ratio of the compound having an alcoholic hydroxyl group to the cyclic compound having a carbonyl group is preferably (99 to 50)/(1 to 50), and more preferably (97 to 60)/(3 to 40). When an amount of the compound having an alcoholic hydroxyl group is more than 99% by weight (an amount of the cyclic compound having a carbonyl group is less than 1% by weight), the compatibility between the polysiloxane and the quinone diazide compound is low and a cured film is whitened, resulting in the deterioration of transparency of the cured film. Further, when the amount of the compound having an alcoholic hydroxyl group is less than 50% by weight (the amount of a cyclic compound having a carbonyl group is more than 50% by weight), a condensation reaction of an unreacted silanol in the polysiloxane is apt to occur and storage stability becomes poor.

The photosensitive siloxane composition of the present invention may contain other solvents as long as the solvent does not impair an effect of the present invention. Examples of other solvents include esters such as ethyl acetate, n-propyl acetate, isopropyl acetate, n-butyl acetate, isobutyl acetate, propylene glycol monomethyl ether acetate, 3-methoxy-1-butyl acetate, 3-methyl-3-methoxy-1-butyl acetate and the like; ketones such as methyl isobutyl ketone, diisopropyl ketone, diisobutyl ketone and the like; and ethers such as diethyl ether, diisopropyl ether, di-n-butyl ether, diphenyl ether, diethyleneglycolmethyl ethyl ether, dipropylene glycol dimethyl ether and the like.

An additive amount of the solvent is preferably within a range of 100 to 1000% by weight with respect to polysiloxane.

The photosensitive siloxane composition of the present invention contains one or more kinds of imidosilane compounds represented by the general formulas (1) to (3). The compounds shown in the paragraph (d) contributes to an improvement in chemical resistance and an improvement in adhesiveness to a substrate of a film formed by thermally curing the composition

[Formula 7]

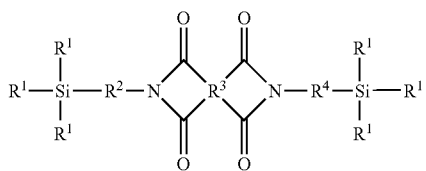
(1)

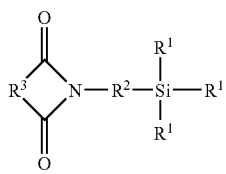
(2)

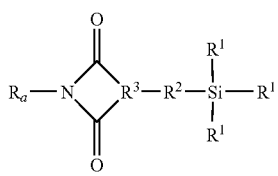
(3)

wherein R¹s may be the same or different and each represents an alkyl group having 1 to 6 carbon atoms, an alkoxy group having 1 to 6 carbon atoms, a phenyl group, a phenoxy group or an organic group replaced with them, $R^2$ and $R^4$ represent each a divalent organic group having 1 to 10 carbon atoms, $R^3$ represents an organic group not containing a silicon atom and having 2 to 20 carbon atoms (provided that $R^3$ represents an organic group other than a phenyl group in the general formula (1) and represents an organic group, not containing an unsaturated bond, other than an alicyclic group in the general formula (2)), and $R_a$ represents a hydrogen atom or an organic group not containing a silicon atom and having 1 to 20 carbon atoms.

Among the imidosilane compounds of a paragraph (d) of the present invention, imidosilane compounds represented by the general formulas (1) and (2) can be readily prepared from the following isocyanate silane compound and acid dianhydride by a publicly known direct imidation process.

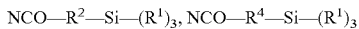

In the above general formulas, R¹s may be the same or different and each represents an alkyl group having 1 to 6 carbon atoms, an alkoxy group having 1 to 6 carbon atoms, a phenyl group, a phenoxy group and an organic group replaced with them.

As the alkyl group, the alkyl groups having 1 to 6 carbon atoms are preferable, and specific examples of the alkyl group include a methyl group, an ethyl group, an n-propyl group, and an isopropyl group. Among them, the methyl group and the ethyl group are preferable in that they can be readily prepared. Further, as the alkoxy group, the alkoxy groups having 1 to 6 carbon atoms are preferable, and specific examples of the alkoxy groups include a methoxy group, an ethoxy group, an n-propoxy group, and an isopropoxy group. Among them, the methoxy group and the ethoxy group are preferable in that they can be readily prepared. Further, R¹ may be an organic group replaced with an alkyl group, an alkoxy group, a phenyl group or a phenoxy group, and examples of groups include 1-methoxypropyl group.

$R^2$ and $R^4$ represent a divalent organic group having 1 to 10 carbon atoms. Specific examples of the divalent organic group include a methylene group, an ethylene group, an n-propylene group, an n-butylene group, an n-pentylene group, an oxymethylene group, an oxyethylene group, an oxy-n-propylene group, an oxy-n-butylene group, and an oxy-n-pentylene group. Among them, the methylene group, the ethylene group, the n-propylene group, and the n-butylene group are preferable in that they can be readily prepared.

$R^3$ represents a structural component of the acid dianhydride in the general formula (1), and this acid dianhydride is an organic group containing an aromatic ring or an aliphatic ring, and is preferably one of tetravalent to tetradecavalent organic groups having 5 to 20 carbon atoms among them. Specific examples of the acid dianhydrides include aromatic tetracarboxylic dianhydrides such as 3,3',4,4'-biphenyltetracarboxylic dianhydride, 2,3,3',4'-biphenyltetracarboxylic dianhydride, 2,2',3,3'-biphenyltetracarboxylic dianhydride, 3,3',4,4'-benzophenonetetracarboxylic dianhydride, 2,2',3,3'-benzophenonetetracarboxylic dianhydride, 2,2-bis(3,4-dicarboxyphenyl)propane dianhydride, 2,2-bis(2,3-dicarboxyphenyl)propane dianhydride, 1,1-bis(3,4-dicarboxyphenyl)ethane dianhydride, 1,1-bis(2,3-dicarboxyphenyl)ethane dianhydride, bis(3,4-dicarboxyphenyl)methane dianhydride, bis(2,3-dicarboxyphenyl)methane dianhydride, bis(3,4-dicarboxyphenyl)sulfone dianhydride, bis(3,4-dicarboxyphenyl)ether dianhydride, 1,2,5,6-naphthalenetetracarboxylic dianhydride, 9,9-bis(3,4-dicarboxyphenyl)fluorenic dianhydride, 9,9-bis{4-(3,4-dicarboxyphenoxy)phenyl}fluorenic dianhydride, 2,3,6,7-naphthalenetetracarboxylic dianhydride, 2,3,5,6-pyridinetetracarboxylic dianhydride, 3,4,9,10-perylenetetracarboxylic dianhydride, 2,2-bis(3,4-dicarboxyphenyl)hexafluoropropane dianhydride, 3,3',4,4'-diphenylsulfonetetracarboxylic dianhydride and the like; hydrogenated pyromellitic dianhydride, butanetetracarboxylic dianhydride, 1,2,3,4-cyclopentanetetracarboxylic dianhydride, 1,2,3,4-cyclobutanetetracarboxylic dianhydride, RIKACID TDA-100 (trade name, manufactured by New Japan Chemical Co., Ltd.), RIKACID BT-100 (trade name, manufactured by New Japan Chemical Co., Ltd.), EPICLONB-4400 (trade name, manufactured by Dainippon Ink and Chemicals, Inc.), and aliphatic tetracarboxylic dianhydrides having the following structures:

[Formula 8]

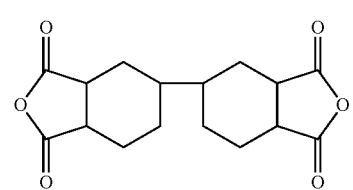

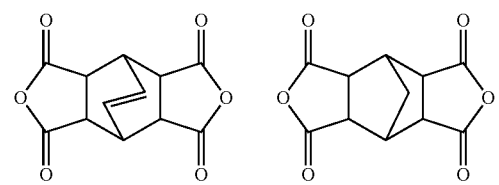

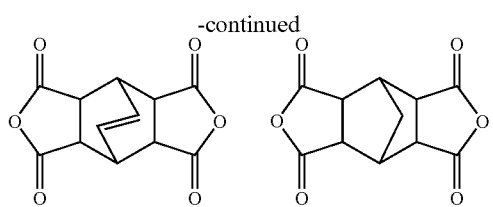

When $R^3$ is an aromatic group such as a tolyl group, a naphthyl group or the like, there is a possibility that the transparency of a cured film obtained from a corresponding composition is deteriorated because the cured film contains a compound having a similar structure to the above-mentioned aromatic imido oligomer of a coloring source. Further, if the composition contains the above-mentioned aromatic group, the compatibility between $R^3$ and the polysiloxane may be deteriorated. Furthermore, if the composition contains the above-mentioned aromatic group, this may cause phase separation and make the film cloudy when preparing the coated film to deteriorate the light transmittance of the cured film. Accordingly, when $R^3$ is the aromatic group, an additive amount of $R^3$ is limited, and therefore $R^3$ is particularly preferably an aliphatic organic group. When $R^3$ is the aliphatic organic group, since the cured film does not have a structure of the coloring source, a transmittance is not reduced, and since the compatibility of $R^3$ with the polysiloxane is high, the cured film can have a high light transmittance without causing the white turbidity incuring the film. Particularly preferable specific examples of the compounds represented by the general formula (1) are shown below. In the present invention, imidosilane compounds represented by the general formula (1) may be used and these imidosilane compounds may be used alone or may be used in combination of two or more species.

[Formula 9]

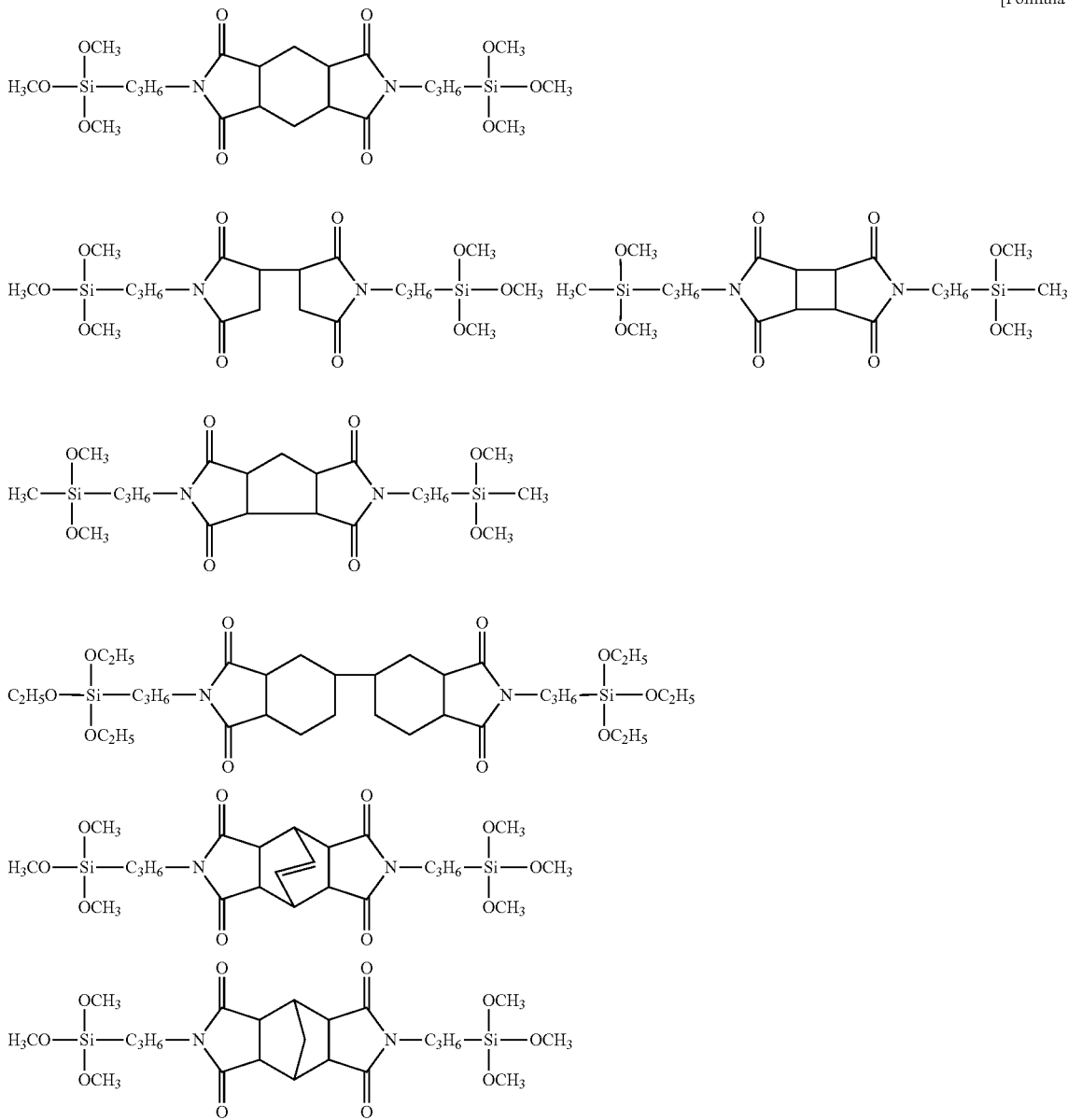

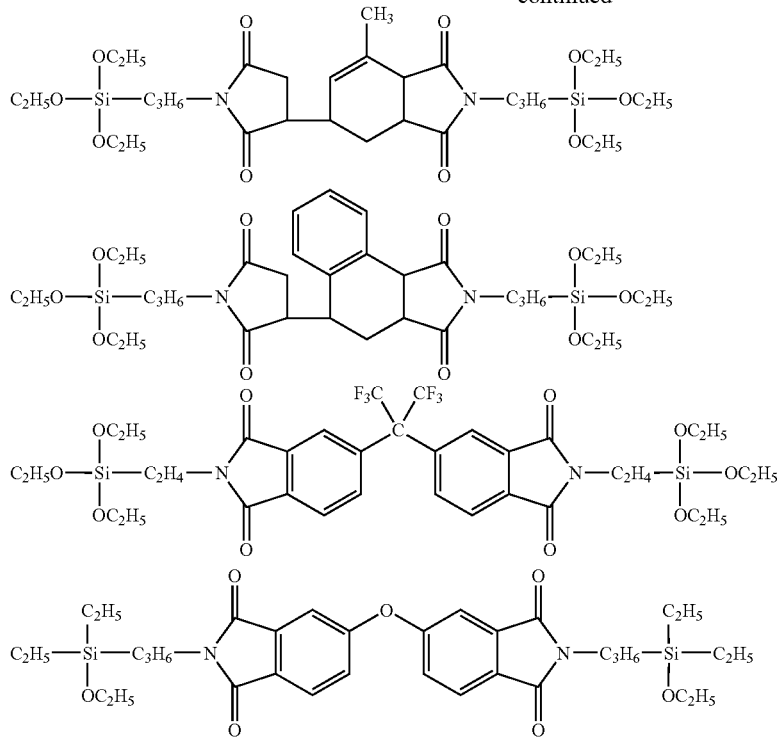

Further, R³ represents a structural component of the acid anhydride in the general formula (2), and this acid anhydride is any one of divalent to tetradecavalent organic groups containing an aliphatic ring other than maleic anhydride and an organic group having 4 to 20 carbon atoms.

Specific examples of the acid anhydrides include succinic anhydride, glutaric anhydride, 4-methylcyclohexane-1,2-dicarboxylic anhydride, cis-4-cyclohexene-1,2-dicarboxylic anhydride, cis-1,2-cyclohexane dicarboxylic anhydride, methyl-5-norbornene-2,3-dicarboxylic anhydride, 5-norbornene-2,3-dicarboxylic anhydride (these are manufactured by TOKYO KASEI KOGYO CO., LTD.), 3,4,5,6-tetrahydrophthalic anhydride (manufactured by Wako Pure Chemical Industries, Ltd.), RIKACID HNA (trade name, manufactured by New Japan Chemical Co., Ltd.), and RIKACID HNA-100 (trade name, manufactured by New Japan Chemical Co., Ltd.). Among them, particularly preferable acid anhydrides are succinic anhydride, glutaric anhydride, 4-methylcyclohexane-1,2-dicarboxylic anhydride, and 5-norbornene-2,3-dicarboxylic anhydride. Among them, succinic anhydride, glutaric anhydride, and 5-norbornene-2,3-dicarboxylic anhydride are particularly preferable from the viewpoint of transparency and adhesiveness. With respect these, R³ represents an organic group, not containing an unsaturated bond, not containing a silicon atom and having 2 to 20 carbon atoms, other than an alicyclic group in the general formula (2).

Among the imidosilane compounds of a paragraph (d) of the present invention, imidosilane compounds represented by the general formula (3) can be readily obtained by a publicly known imidation process in which an imidosilane compound is synthesized from an amine compound and an acid anhydride-containing compound through amic acid.

The amine compound can be obtained from the following primary amine and the acid anhydride-containing compound can be obtained from the following acid anhydride-containing silane compound.

[Formula 10]

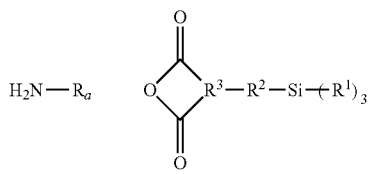

In the above general formulas, R¹s may be the same or different and each represents an alkyl group having 1 to 6 carbon atoms, an alkoxy group having 1 to 6 carbon atoms, a phenyl group, a phenoxy group and an organic group replaced with them.

As the alkyl group, the alkyl groups having 1 to 6 carbon atoms are preferable, and specific examples of the alkyl group include a methyl group, an ethyl group, an n-propyl group, and an isopropyl group. Among them, the methyl group and the ethyl group are preferable in that they can be readily prepared. Further, as the alkoxy group, the alkoxy groups having 1 to 6 carbon atoms are preferable, and specific examples of the alkoxy groups include a methoxy group, an ethoxy group, an n-propoxy group, and an isopropoxy group. Among them, the methoxy group and the ethoxy group are preferable in that they can be readily prepared. Further, R¹ may be an organic group replaced with an alkyl group, an alkoxy group, a phenyl group or a phenoxy group, and examples of groups include a 1-methoxypropyl group.

R² represents a divalent organic group having 1 to 10 carbon atoms. Specific examples of the divalent organic group include a methylene group, an ethylene group, an n-propylene group, an n-butylene group, an n-pentylene group, an oxymethylene group, an oxyethylene group, an oxy-n-propylene group, an oxy-n-butylene group, and an oxy-n-pentylene group. Among them, the methylene group, the ethylene group, the n-propylene group, and the n-butylene group are preferable in that they can be readily prepared.

$R_a$ represents a structural component of the above-mentioned primary amine and represents an organic group not containing a hydrogen atom and a silicon atom and having 1 to 20 carbon atoms. Specific examples of the organic groups include a methyl group, an ethyl group, an n-propyl group, an isopropyl group, an n-butyl group, a t-butyl group, a cyclohexyl group, a 2-hydroxyethyl group, a phenyl group, a methoxyphenyl group, a methoxy group, an ethoxy group, an n-propoxy group, and an isopropoxy group. Among them, the methoxy group and the ethoxy group are preferable in that they can be readily prepared. $R_a$ may be an organic group replaced with an alkyl group, an alkoxy group, a phenyl group or a phenoxy group, and examples of the groups include a 1-methoxypropyl group. Among them, a hydrogen atom, a methyl group, an ethyl group, a t-butyl group, a 2-hydroxyethyl group, and a phenyl group are preferable in that they exhibit high adhesiveness and are easily available.

$R^3$ represents a structural component of acid anhydride in the above-mentioned acid anhydride-containing silane, and this acid anhydride is an organic group containing an aromatic ring or an aliphatic ring and any one of trivalent to tetradecavalent organic groups having 4 to 20 carbon atoms. Specific examples of the acid anhydrides include maleic anhydride, phthalic anhydride, methylphthalic anhydride, succinic anhydride, glutaric anhydride, 4-methylcyclohexane-1,2-dicarboxylic anhydride, cis-4-cyclohexene-1,2-dicarboxylic anhydride, cis-1,2-cyclohexane dicarboxylic anhydride, 1,8-naphthalic anhydride, methyl-5-norbornene-2,3-dicarboxylic anhydride, 5-norbornene-2,3-dicarboxylic anhydride (these are manufactured by TOKYO KASEI KOGYO CO., LTD.), 3,4,5,6-tetrahydrophthalic anhydride (manufactured by Wako Pure Chemical Industries, Ltd.), RIKACID HNA (trade name, manufactured by New Japan Chemical Co., Ltd.), and RIKACID HNA-100 (trade name, manufactured by New Japan Chemical Co., Ltd.). Among them, particularly preferable acid anhydrides are phthalic anhydride, succinic anhydride, glutaric anhydride, 4-methyl-cyclohexane-1,2-dicarboxylic anhydride, 1,8-naphthalic anhydride, 5-norbornene-2,3-dicarboxylic anhydride, and methylphthalic anhydride. Among them, succinic anhydride, glutaric anhydride, and 5-norbornene-2,3-dicarboxylic anhydride are particularly preferable from the viewpoint of transparency and adhesiveness.

Furthermore, silane compounds of the general formula (2) can be obtained by the synthetic method of silane compounds of the general formula (3), that is, can be obtained from the following aminosilane compound and acid anhydride as an amine compound.

[Formula 11]

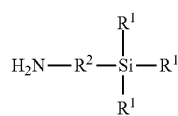

In the above general formula, $R^1$s maybe the same or different and each represents an alkyl group having 1 to 6 carbon atoms, an alkoxy group having 1 to 6 carbon atoms, a phenyl group, a phenoxy group and an organic group replaced with them.

As the alkyl group, the alkyl groups having 1 to 6 carbon atoms are preferable, and specific examples of the alkyl group include a methyl group, an ethyl group, an n-propyl group, and an isopropyl group. Among them, the methyl group and the ethyl group are preferable in that they can be readily prepared.

As $R^2$, a methylene group, an ethylene group, an n-propylene group, and a butylene group are preferable in that they can be readily prepared. As a synthetic method of silane compounds of the general formula (2), a direct imidation process, in which a silane compound is synthesized from an isocyanate silane compound and acid anhydride as with the silane compounds of the general formula (1), is particularly preferable from the viewpoint of preventing coloring due to a by-product.

Among these imidosilane compounds represented by the general formulas (1) to (3), the imidosilane compound represented by the general formula (3) is particularly preferable since an imido group is directed to such a direction that a nitrogen atom of the imido group is coupled with a Si atom via a C=O bond of the imido group therebetween and therefore the nitrogen atom of the imido group and a substrate can interact with efficiency.

A cured film of polysiloxane, which is a ladder-like crosslinked polymer referred to herein, is generally brittle. This cured film has a problem that cracks are generated in the cured film particularly when the cured film is dipped into an alkaline solvent. Since the compounds represented by the general formulas (1) to (3) has an imido site, which is solvent-resistant, highly adhesive and highly flexible, within their structures and has a silane compound at both ends, a composition to which the compounds have been added reacts with polysiloxane in curing, and the imido site is incorporated into the cured film through an organic bond, and therefore the cured film becomes flexible and the solvent resistance of the cured film is improved. Furthermore, the compounds does not suffer from shrinkage during curing resulting from imido conversion by heat because the compounds do not have an amino acid structure which is an imido precursor as described above, and has a good planarization property.

An additive amount of the imidosilane compound represented by the general formulas (1) to (3) is preferably within a range of 0.1 to 10% by weight with respect to polysiloxane. When the additive amount is smaller than 0.1% by weight, the imidosilane compound does not adequately exert effects on adhesiveness and solvent resistance, and when the additive amount is larger than 20% by weight, the imidosilane compound exhibits a function as a plasticizer during patterning to cause sagging in patterning and therefore resolution may be deteriorated.

Furthermore, a thermal acid generator may be used for the photosensitive siloxane composition of the present invention at a content within the range in which an effect of the present invention is not impaired.

Specific examples of the thermal acid generator preferably used include SI-60, SI-80, SI-100, SI-110, SI-145, SI-150, SI-60L, SI-80L, SI-100L, SI-110L, SI-145L, SI-150L, SI-160L and SI-180L (everything manufactured by SANSHIN CHEMICAL INDUSTRY CO., LTD.), 4-hydroxyphenyldimethylsulfonium, benzyl-4-hydroxyphenylmethylsulfonium, 2-methylbenzyl-4-hydroxyphenylmethylsulfonium, 2-methylbenzyl-4-acetylphenylmethylsulfonium, 2-methylbenzyl-4-benzoyloxyphenylmethylsuluonium, and methanesulfonates thereof, trifluoromethanesulfonates, camphorsulfonates and p-toluenesulfonates. More preferable thermal acid generators are 4-hydroxyphenyldimethylsulfonium, benzyl-4-hydroxyphenylmethylsulfonium, 2-methylbenzyl-4-hydroxyphenylmethylsulfonium, 2-methylbenzyl-4-acetylphenylmethylsulfonium, 2-methylbenzyl-4-benzoyloxyphenylmethylsuluonium, methanesulfonates thereof, trifluoromethanesulfonates, camphorsulfonates and p-toluenesulfonates. Further, these compounds may be used alone or may be used in combination of two or more species.

A preferable additive amount of the thermal acid generator is 0.01 to 10 parts by weight with respect to 100 parts by weight of a siloxane polymer, and a more preferable additive amount is 0.01 to 0.5 parts by weight. When the additive amount is smaller than 0.01 parts by weight, a function as a crosslinking promoter of the siloxane polymer is not adequately exhibited and a cured film becomes a low hardness film, and when the additive amount is larger than 10 parts by weight, this causes reduction in sensitivity, generation of cracks, or deterioration of transparency.

Furthermore, the photosensitive siloxane composition of the present invention may contain a heat crosslinking agent. The heat crosslinking agent is a compound which crosslinks polysiloxane at the time of thermal curing and is incorporated into a polysiloxane skeleton through crosslinking. A degree of crosslinking of the cured film is increased by containing the heat crosslinking agent. Thereby, the solvent resistance of the cured film is improved.

The heat crosslinking agent is not particularly limited as long as it is a compound which crosslinks polysiloxane and is incorporated into the polysiloxane skeleton at the time of thermal curing, but preferable examples of the heat crosslinking agent include a compound having two or more structures selected from the group consisting of groups represented by the general formula (6), an epoxy structure and an oxetane structure. A combination of the above-mentioned structures is not particularly limited, but structures to be selected are preferably the same.

[Formula 12]

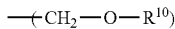

(6)

$R^{10}$ represents either hydrogen or an alkyl group having 1 to 10 carbon atoms. Further, plural $R^{10}$s in a compound may be the same or different.

In the compounds having two or more groups represented by the general formula (6), $R^{10}$ represents either hydrogen or an alkyl group having 1 to 10 carbon atoms. Plural $R^{10}$s in a compound may be the same or different. Specific examples of the alkyl group include a methyl group, an ethyl group, an n-propyl group, an isopropyl group, an n-butyl group, a t-butyl group, an n-hexyl group, and an n-decyl group.

Specific examples of the compounds having two or more groups represented by the general formula (6) include the following melamine derivatives and urea derivatives (trade name, manufactured by SANWA CHEMICAL CO., LTD.), and phenolic compound (trade name, manufactured by Honshu Chemical Industry Co., Ltd.).

[Formula 13]

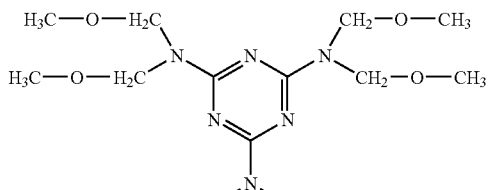

NIKALAC MW-30HM

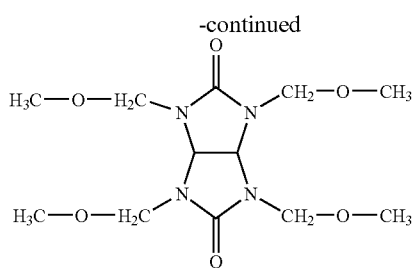

NIKALAC MX-270

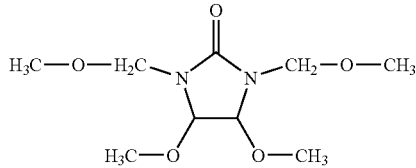

NIKALAC MX-280

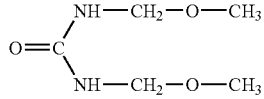

NIKALAC MX-290

Specific examples of the compounds having two or more epoxy structures include "Epolite" 40E, "Epolite" 100E, "Epolite" 200E, "Epolite" 400E, "Epolite" 70P, "Epolite" 200P, "Epolite" 400P, "Epolite" 1500NP, "Epolite" 80MF, "Epolite" 4000, "Epolite" 3002 (these are trade names, manufactured by Kyoeisha Chemical Co., Ltd.), "DENACOL" EX-212L, "DENACOL" EX-214L, "DENACOL" EX-216L, "DENACOL" EX-850L, "DENACOL" EX-321L (these are trade names, manufactured by Nagase ChemteX Corp.), GAN, GOT, EPPN 502H, NC 3000, NC 6000 (these are trade names, manufactured by Nippon Kayaku Co., Ltd.), "EPICOAT" 828, "EPICOAT" 1002, "EPICOAT" 1750, "EPICOAT" 1007, YX8100-BH30, E1256, E4250, E4275 (these are trade names, manufactured by Japan Epoxy Resins Co., Ltd.), "EPICLON" EXA-9583, HP4032, "EPICLON" N695, HP7200 (these are trade names, manufactured by Dainippon Ink and Chemicals, Inc.), "TEPIC" S, "TEPIC" G, "TEPIC" P (these are trade names, manufactured by Nissan Chemical Industries, Ltd.), and "EPOTOHTO" YII-434L (trade name, manufactured by TOHTO KASEI CO., LTD.).

Specific examples of the compounds having two or more oxetane structures include OXT-121, OXT-221, OX-SQ-H, OXT-191, PNOX-1009, RSOX (these are trade names, manufactured by TOAGOSEI CO., LTD.), and "ETERNACOLL" OXBP, "ETERNACOLL" OXTP (these are trade names, manufactured by Ube Industries, Ltd.).

The above-mentioned heat crosslinking agents may be used alone or may be used in combination of two or more species.

An additive amount of the heat crosslinking agent is not particularly limited, but it is preferably within a range of 0.1 to 10% by weight with respect to polysiloxane. When the additive amount of the heat crosslinking agent is smaller than 0.1% by weight, crosslinking of polysiloxane is inadequate and an effect of the heat crosslinking agent is small. On the other hand, when the additive amount of the heat crosslinking agent is larger than 10% by weight, a transparent and colorless property of the cured film is deteriorated or storage stability of the composition is deteriorated.

The photosensitive siloxane composition of the present invention may also contain additives such as a dissolution inhibitor, a surfactant, a stabilizer and an antifoaming agent as required.

A method of forming a cured film by use of the photosensitive siloxane composition of the present invention will be described. The photosensitive siloxane composition of the present invention is applied onto a base substrate by a publicly known method such as a spinner, dipping, a slit or the like and prebaked by a heating apparatus such as a hot plate, an oven or the like. The prebake is preferably carried out at a temperature of 50 to 150° C. for 30 seconds to 30 minutes to form a film thickness of 0.1 to 15 µm after the prebake.

After completion of pre-baking, the film is patterned and exposed through a desired mask at about 10 to about 4000 J/m$^2$ (on the exposure amount at wavelength 365 nm equivalent basis) with an ultraviolet and visible light exposure machine such as a stepper, a mirror projection mask aligner (MPA) or a parallel light mask aligner (PLA). The photosensitive siloxane composition of the present invention preferably has sensitivity which is 100 to 4000 J/m$^2$ at exposure by the PLA. When the sensitivity is lower than 4000 J/m$^2$, the radiation exposure time during patterning becomes long to lower productivity and to increase the radiation exposure amount, thereby increasing the reflection from the base substrate to deteriorate the pattern form.

The sensitivity at patterning exposure by the PLA is determined by the following method. The composition is applied onto a silicon wafer by spin-coating at an arbitrary rotating speed with a spin coater, and the applied composition is pre-baked at 115° C. for 2 minutes with a hot plate to prepare a film having a film thickness of 4 µm. The prepared film is exposed to an ultra high pressure mercury lamp through a gray scale mask for sensitivity measurement with the PLA (PLA-501F manufactured by Canon Inc.). The exposed film is developed by paddling of 2.38% by weight aqueous solution of tetramethylammonium hydroxide for an arbitrary time with an automatic developing apparatus (AD-2000 manufactured by Takizawa Sangyo Co., Ltd.), and then rinsed with water for 30 seconds. In the formed pattern, the exposure amount at which a 10 µm line and space pattern is resolved at a width ratio of 1:1 is identified as the sensitivity.

After patterning exposure, an exposed area can be dissolved by development to obtain a positive type pattern. As for a developing method, it is preferred to immerse the coated substrate in a developer for 5 seconds to 10 minutes with a method such as showering, dipping or paddling. As the developer, publicly known alkaline developers can be employed. Specific examples of the alkaline developers include aqueous solutions containing one or more kinds of inorganic alkalis such as hydroxide, carbonate, phosphate, silicate and borate of alkali metals, amines such as 2-diethylaminoethanol, monoethanolamine, diethanolamine and the like, and quaternary ammonium salts such as tetramethylammonium hydroxide, choline and the like.

After development, the film is preferably rinsed with water, and subsequently, it can also be dry-baked in a temperature range of 50 to 150° C.

Thereafter, it is preferable to perform bleaching exposure. By performing bleaching exposure, an unreacted quinone diazide compound remaining in the film is photo-decomposed to further improve the optical transparency of the film. As for a bleaching exposure method, the entire surface of the developed film is exposed at about 100 to about 4000 J/m$^2$ (on the exposure amount at wavelength 365 nm equivalent basis) with an ultraviolet and visible light exposure machine such as PLA.

Thereafter, this film is thermally cured at a temperature of 150 to 450° C. for about 1 hour with a heating apparatus such as a hot plate, an oven or the like. Resolution is preferably 10 µm or less.

The photosensitive siloxane composition of the present invention can form a cured film whose light transmittance per a film thickness of 3 µm is 95% or more at a wavelength of 400 nm and more preferably 98% or more. If the light transmittance of the cured film is lower than 95%, when the cured film is used as a planarization film for a TFT substrate of a liquid crystal display device, backlight changes in color at the time of passing through the planarization film and takes on a yellow tinge in white display.

The transmittance per a film thickness of 3 µm at a wavelength of 400 nm is determined by the following method. The composition is applied onto a Tempax glass sheet by spin-coating at an arbitrary rotating speed with a spin coater, and the applied composition is pre-baked at 115° C. for 2 minutes with a hot plate. Thereafter, as bleaching exposure, the entire surface of the film is exposed to an ultra high pressure mercury lamp at 6000 J/m$^2$ (on the exposure amount at wavelength 365 nm equivalent basis) with the PLA, and the film is thermally cured at 250° C. for 1 hour in the air with an oven to prepare a cured film. The ultraviolet and visible absorption spectra of the obtained cured film are measured with Multi Spec-1500 manufactured by SHIMADZU CORP. to determine a transmittance per a film thickness of 3 µm at a wavelength of 400 nm.

This cured film is suitably used for a planarization film for a TFT in a display device, an interlayer insulation film in a semiconductor device or a core or clad material in a light waveguide.

Examples of the device of the present invention include a display device, a semiconductor device and materials for a light waveguide. Since the device of the present invention has a cured film having high resolution, high hardness, high transparency and high heat resistance of the present invention described above, particularly, a liquid crystal display device and an organic EL display device, in which the cured film of the device of the present invention is used as the planarization film for a TFT, are superior in brightness of a screen and reliability.

EXAMPLES

Hereinafter, the present invention will be described by way of examples, but the aspects of the present invention are not limited to these examples. Further, compounds, for which an abbreviation is used, of the compounds used in Examples are shown below.

DAA: Diacetone alcohol
EDM: Diethylene glycol ethyl methyl ether
HPE: 2-hydroxypropionic acid ethyl
GBL: gamma-butyrolactone
SiDA: 1,3-bis(3-aminopropyl)tetramethyldisiloxane Synthesis Example 1

Synthesis of Polysiloxane Solution (i)

Into a 500 ml three-necked flask, 74.91 g (0.65 mole) of methyltrimethoxysilane, 69.41 g (0.35 mole) of phenyltrimethoxysilane and 150.36 g of diacetone alcohol (DAA) are charged, and to the resulting mixture, an aqueous phosphoric acid solution having 0.338 g (0.2% by weight with respect to the weight of charged monomers) of phosphoric acid dissolved in 55.8 g of water was added over 10 minutes while stirring the mixture at room temperature. Thereafter, the flask was immersed in an oil bath of 70° C., the resulting mixture was stirred for 1 hour, and then the oil bath was heated up to 115° C. over 30 minutes. A temperature of the solution reached 100° C. after a lapse of one hour from the start of heating and the solution was heated and stirred for further 2 hours (the temperature of the solution was 100 to 110° C. in the meantime). During the reaction, 115 g in total of methanol and water as by-products were distilled out. To the resulting DAA solution of polysiloxane, DAA was added so as to achieve a polymer concentration of 43% by weight to obtain a polysiloxane solution (i). The obtained polymer had a weight average molecular weight (Mw) of 6000 and a phenyl group content of 35% with respect to the amount of Si atoms. The weight average molecular weight of the polymer was measured on the polystyrene equivalent basis by GPC (gel permeation chromatography) (eluent: tetrahydrofuran, flow rate: 0.4 ml/min). The content of the phenyl group was determined by measuring a $^{29}$Si-nuclear magnetic resonance spectrum of polysiloxane and calculating a ratio of the peak area of Si having a phenyl group bonded to the peak area of Si having no phenyl group bonded.

Synthesis Example 2

Synthesis of Polysiloxane Solution (ii)

Into a 500 ml three-necked flask, 63.39 g (0.55 mole) of methyltrimethoxysilane, 69.41 g (0.35 mole) of phenyltrimethoxysilane, 24.64 g (0.1 mole) of 2-(3,4-epoxycyclohexyl)ethyltrimethoxysilane and 150.36 g of DAA are charged, and to the resulting mixture, an aqueous phosphoric acid solution having 0.338 g (0.2% by weight with respect to the weight of charged monomers) of phosphoric acid dissolved in 55.8 g of water was added over 10 minutes while stirring the mixture at room temperature. Thereafter, the flask was immersed in an oil bath of 70° C., the resulting mixture was stirred for 1 hour, and then the oil bath was heated up to 115° C. over 30 minutes. A temperature of the solution reached 100° C. after a lapse of one hour from the start of heating and the solution was heated and stirred for further 2 hours (the temperature of the solution was 100 to 110° C. in the meantime). During the reaction, 115 g in total of methanol and water as by-products were distilled out. To the resulting DAA solution of polysiloxane, DAA was added so as to achieve a polymer concentration of 43% by weight to obtain a polysiloxane solution (ii). The obtained polymer had a weight average molecular weight (Mw) of 5000 and a phenyl group content of 35% with respect to the amount of Si atoms.

Synthesis Example 3

Synthesis of Solysiloxane Solution (iii)

Into a 500 ml three-necked flask, 23.84 g (0.175 mole) of methyltrimethoxysilane, 99.15 g (0.5 mole) of phenyltrimethoxysilane, 12.32 g (0.05 mole) of 2-(3,4-epoxycyclohexyl)trimethoxysilane, 62.58 g (27.5 moles in number of atoms of silane) of Quartron PL-2L-DAA (manufactured by FUSO CHEMICAL CO., LTD.: solid content 26.4% by weight) which is a dispersion of silica particle in an DAA solvent and 209.47 g of DAA are charged, and to the resulting mixture, an aqueous phosphoric acid solution having 0.181 g of phosphoric acid dissolved in 40.05 g of water was added over 30 minutes while stirring the mixture at room temperature. Thereafter, the flask was immersed in an oil bath of 40° C., the resulting mixture was stirred for 30 minutes, and then the oil bath was heated up to 115° C. over 30 minutes. A temperature of the solution reached 100° C. after a lapse of one hour from the start of heating and the solution was heated and stirred for further 45 minutes (the temperature of the solution was 100 to 110° C. in the meantime). During the reaction, 89 g in total of methanol and water as by-products were distilled out. To the resulting DAA solution of polysiloxane, DAA was added so as to achieve a polymer concentration of 43% by weight to obtain a polysiloxane solution (iii). The obtained polymer had a weight average molecular weight (Mw) of 5500 and a phenyl group content of 50 mol % with respect to the amount of Si atoms.

Synthesis Example 4

Synthesis of Quinone Diazide Compound (iv)

In a dry nitrogen stream, 21.23 g (0.05 mole) of TrisP-PA (trade name, manufactured by Honshu Chemical Industry Co., Ltd.) and 37.62 g (0.14 mole) of 5-naphthoquinonediazidesulfonylic acid chloride were dissolved into 450 g of 1,4-dioxane, and the solution was kept at room temperature. To the solution, 15.58 g (0.154 mole) of triethylamine mixed with 50 g of 1,4-dioxane was added dropwise while keeping an internal temperature of a system at lower than 35° C. After the completion of dropwise addition, the resulting mixture was stirred at 30° C. for 2 hours. Triethylamine salt was separated by filtration and filtrate was charged into water. Thereafter, the formed precipitate was collected by filtration. This precipitate was dried with a vacuum drier to obtain a quinone diazide compound (iv) having the following structure, whose esterification rate was 93%.

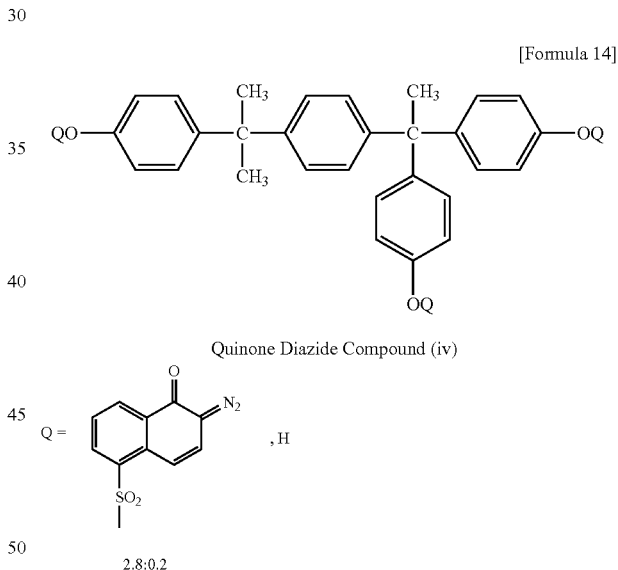

Quinone Diazide Compound (iv)

Synthesis Example 5

Synthesis of Quinone Diazide Compound (v)

In a dry nitrogen stream, 15.32 g (0.05 mole) of TrisP-HPA (trade name, manufactured by Honshu Chemical Industry Co., Ltd.) and 30.9 g (0.115 mole) of 5-naphthoquinonediazidesulfonylic acid chloride were dissolved into 450 g of 1,4-dioxane, and the solution was kept at room temperature. To the solution, 13.03 g (0.127 mole) of triethylamine mixed with 50 g of 1,4-dioxane was added dropwise while keeping an internal temperature of a system at lower than 35° C. After the completion of dropwise addition, the resulting mixture was stirred at 30° C. for 2 hours. Triethylamine salt was separated by filtration and filtrate was charged into water. Thereafter, the formed precipitate was collected by filtration. This precipitate was dried with a vacuum drier to obtain a quinone diazide compound (v) having the following structure, whose esterification rate was 93%.

[Formula 15]

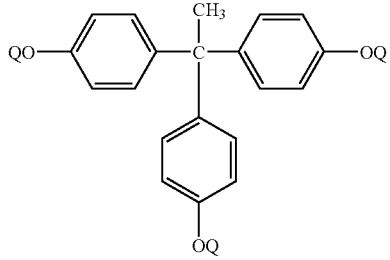

Quinone Diazide Compound (v)

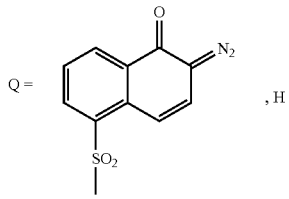

2.3:0.7

Synthesis Example 6

Synthesis of Imidosilane Compound (vi)

32.84 g (160 mmol) of isocyanatepropyltrimethoxysilane was added to 40 g of GBL and the resulting mixture was stirred and dissolved. To this, 17.93 g (80 mmol) of hydrogenated pyromellitic dianhydride was added, and the resulting mixture was stirred at room temperature for a while and stirred at 140° C. for further 2 hours. The resulting solution was diluted with GBL so as to achieve a solid matter concentration of 20% to obtain a solution of an imidosilane compound (vi) represented by the following structure.

[Formula 16]

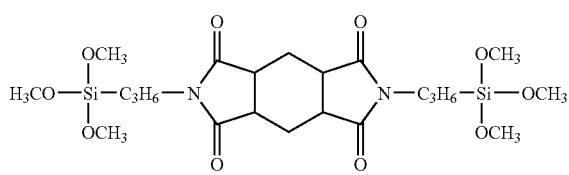

Synthesis Example 7

Synthesis of Imidosilane Compound (vii)

34.46 g (160 mmol) of isocyanatepropyldiethylethoxysilane was added to 40 g of GBL and the resulting mixture was stirred and dissolved. To this, 24.82 g (80 mmol) of 4,4'-oxydiphthalic dianhydride was added, and the resulting mixture was stirred at room temperature for a while and stirred at 140° C. for further 2 hours. The resulting solution was diluted with GBL so as to achieve a solid matter concentration of 20% to obtain a solution of an imidosilane compound (vii) represented by the following structure.

[Formula 17]

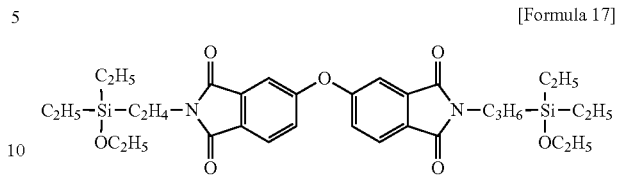

Synthesis Example 8

Synthesis of Imidosilane Compound (viii)

25.17 g (160 mmol) of isocyanatepropyltrimethylsilane was added to 40 g of GBL and the resulting mixture was stirred and dissolved. To this, 15.69 g (80 mmol) of 1,2,3,4-cyclobutanetracarboxylic dianhydride was added, and the resulting mixture was stirred at room temperature for a while and stirred at 160° C. for further 2 hours. The resulting solution was diluted with GBL so as to achieve a solid matter concentration of 20% to obtain a solution of an imidosilane compound (viii) represented by the following structure.

[Formula 18]

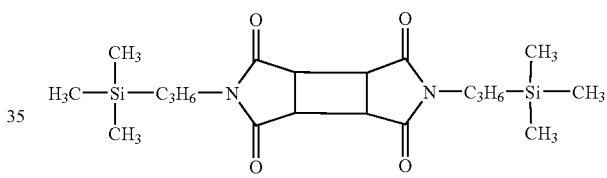

Synthesis Example 9

Synthesis of Imidosilane Compound (ix)

19.79 g (80 mmol) of isocyanatepropyltriethoxysilane and 16.42 g (80 mmol) of isocyanatepropyltrimethoxysilane were added to 40 g of GBL and the resulting mixture was stirred and dissolved. To this, 24.02 g (80 mmol) of RIKACID BT-100 (trade name, manufactured by New Japan Chemical Co., Ltd.) was added, and the resulting mixture was stirred at room temperature for a while and stirred at 160° C. for further 2 hours. The resulting solution was diluted with GBL so as to achieve a solid matter concentration of 20% to obtain a solution of an imidosilane compound (ix) represented by the following structure.

[Formula 19]

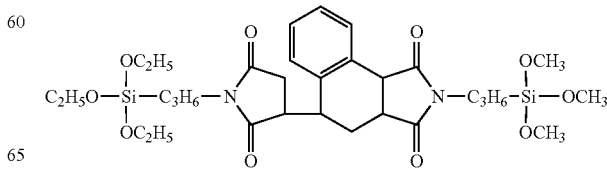

Synthesis Example 10

Synthesis of Aromatic Bisimide Oligomer (x)

Into a container equipped with a stirrer, a reflux cooler and a nitrogen inlet tube, 32.58 g (220 mmol) of phthalic anhydride, 1.39 g of gamma-picoline and 130.3 g of N-methyl-2-pyrolidone (hereinafter, abbreviated as NMP) were charged, and to this, 24.8 g (100 mmol) of SiDA dissolved in 99.4 g of NMP was added dropwise, and the resulting mixture was stirred for 2 hours in an atmosphere of nitrogen. Thereafter, 40.8 g (400 mmol) of acetic anhydride was added and the resulting mixture was heated up to 70° C. in an atmosphere of nitrogen while stirring and reacted at 70° C. for 4 hours. After the completion of the reaction, a reactant was cooled to room temperature and charged into about 2000 ml of water to obtain 43.24 g of bisimide powder. Infrared absorption spectra of the bisimide powder were measured to identify characteristic absorption of an imido ring at 1720 $cm^{-1}$ and 1780 $cm^{-1}$. The obtained bisimide powder was dissolved in GBL so as to achieve a solid matter concentration of 20% to obtain a solution of an aromatic bisimide oligomer (x) represented by the following structure.

[Formula 20]

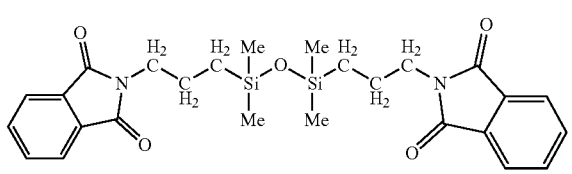

Synthesis Example 11

Synthesis of Silicone Polyimide Precursor Compound (xi)

35.42 g (160 mmol) of aminopropyltriethoxysilane was added to 40 g of GBL and the resulting mixture was stirred and dissolved. To this, 24.82 g (80 mmol) of 4,4'-oxydiphthalic dianhydride was added, and the resulting mixture was stirred at room temperature for a while and stirred at 40° C. for further 2 hours. The resulting solution was diluted with GBL so as to achieve a solid matter concentration of 20% to obtain a solution of a silicone polyimide precursor compound (xi) represented by the following structure.

Synthesis Example 12

Synthesis of Acrylic Resin Solution (xii)

5 g of 2,2'-azobis(2,4-dimethylvaleronitrile) and 200 g of diethylene glycol ethyl methyl ether (EDM) were charged into a 500 ml three-necked flask. Subsequently, 25 g of styrene, 20 g of methacrylic acid, 45 g of glycidyl methacrylate and 10 g of tricyclo[$5.2.1.0^{2,6}$]decane-8-yl methacrylate were added, the resulting mixture was stirred at room temperature for a while, and the atmosphere in the flask was replaced with nitrogen. Thereafter, the flask was immersed in an oil bath of 70° C. and the mixture was heated and stirred for 5 hours. To the resulting EDM solution of acrylic resin, EDM was further added so as to achieve a polymer concentration of 43% by weight to obtain an acrylic resin solution (xii). The weight average molecular weight (Mw) of the obtained polymer was 15000.

Synthesis Example 13

Synthesis of Novolac Resin Solution (xiii)

To a 2 liter separable flask equipped with a cooling tube and a stirrer, 172.8 g (1.6 mole) of m-cresol, 36.6 g (0.3 mole) of 2,3-dimethylphenol, 12.2 g (0.1 mole) of 3,4-dimethylphenol, 12.6 g of a 37% by weight aqueous solution of formaldehyde (formaldehyde: 1.5 mole), 12.6 (0.1 mole) of oxalic acid dehydrate and 554 g of methyl isobutyl ketone were added and the resulting mixture was stirred for 30 minutes and left standing for one hour to be separated into two layers. An upper layer of two layers was removed by decantation. 2-hydroxypropionic acid ethyl (HPE) was added to a lower layer, and remaining methyl isobutyl ketone and water were removed by vacuum concentration to obtain a HPE solution of a novolac resin. HPE was added to the HPE solution of a novolac resin obtained so as to achieve a polymer concentration of 43% by weight to obtain a HPE solution of a novolac resin (xiii).

Further, structures of the compounds used in Examples or the like are shown below.

[Formula 21]

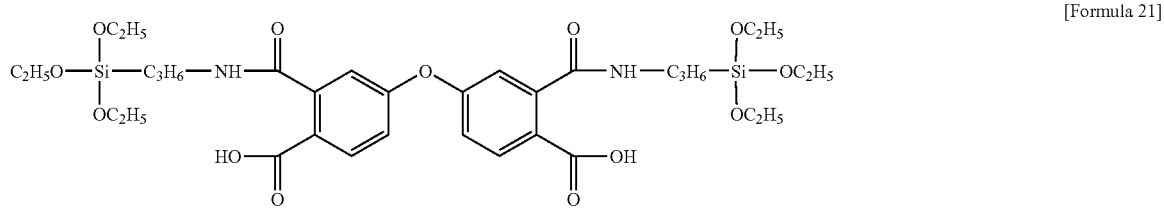

[Formula 22]

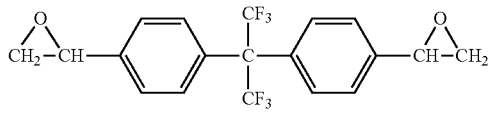

EPICOAT 828

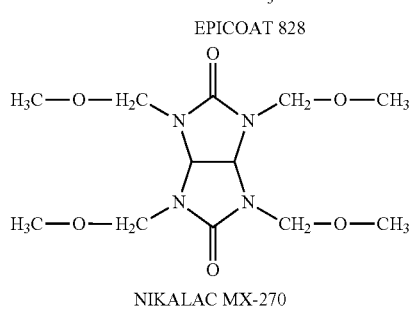

NIKALAC MX-270

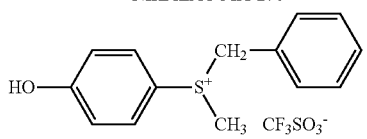

Benzyl-4-hydroxyphenylmet
hylsulfonium
trifluoromethanesulfonate
(BHPMT)

Synthesis Example 14

Synthesis of Imidosilane Compound (vi-2)

32.84 g (160 mmol) of isocyanatepropyltrimethoxysilane was added to 40 g of GBL and the resulting mixture was stirred and dissolved. To this, 23.70 g (160 mmol) of phthalic anhydride was added, and the resulting mixture was stirred at room temperature for a while and stirred at 140° C. for further 2 hours. The resulting solution was diluted with GBL so as to achieve a solid matter concentration of 20% to obtain a solution of an imidosilane compound (vi-2) represented by the following structure.

[Formula 23]

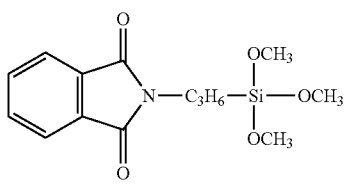

Synthesis Example 15

Synthesis of Imidosilane Compound (vii-2)

34.46 g (160 mmol) of isocyanatepropyldiethylethoxysilane was added to 40 g of GBL and the resulting mixture was stirred and dissolved. To this, 18.26 g (160 mmol) of glutaric anhydride was added, and the resulting mixture was stirred at room temperature for a while and stirred at 60° C. for further 2 hours. The mixture was stirred at 140° C. for 2 hours. The resulting solution was diluted with GBL so as to achieve a solid matter concentration of 20% to obtain a solution of an imidosilane compound (vii-2) represented by the following structure.

[Formula 24]

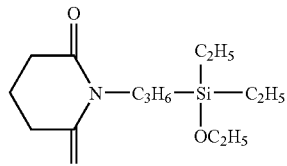

Synthesis Example 16

Synthesis of Imidosilane Compound (viii-2)

35.42 g (160 mmol) of aminopropyltriethoxysilane and 16.01 g (160 mmol) of succinic anhydride were added to 400 g of diacetone alcohol, and the resulting mixture was stirred at room temperature for a while and stirred at 60° C. for further 2 hours. Thereafter, the mixture was heated up to 160° C. and reacted for 6 hours while distilling diacetone alcohol and water azeotropically.

The resulting solution was diluted with diacetone alcohol so as to achieve a solid matter concentration of 20% to obtain a solution of an imidosilane compound (viii-2) represented by the following structure.

[Formula 25]

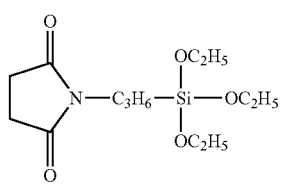

Synthesis Example 17

Synthesis of Imidosilane Compound (vi-3)

41.97 g (160 mmol) of 3-trimethoxysilylpropylsuccinic anhydride and 11.70 g (160 mmol) of tert-butylamine were added to 400 g of propylene glycol monomethyl ether, and the resulting mixture was stirred at room temperature for a while and stirred at 60° C. for further 2 hours. Thereafter, the mixture was heated up to 140° C. and reacted for 6 hours while distilling propylene glycol monomethyl ether and water azeotropically.

The resulting solution was diluted with diacetone alcohol so as to achieve a solid matter concentration of 20% to obtain a solution of an imidosilane compound (vi-3) represented by the following structure.

[Formula 26]

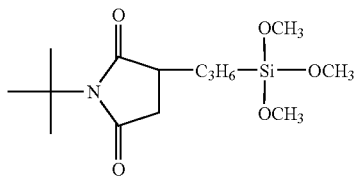

Synthesis Example 18

Synthesis of Imidosilane Compound (vii-3)

23.71 g (80 mmol) of 2-trimethoxysilylethylphthalic anhydride and 4.89 g (80 mmol) of monoethanolamine were added to 400 g of diacetone alcohol, and the resulting mixture was stirred at room temperature for a while and stirred at 60° C. for further 2 hours. Thereafter, the mixture was heated up to 140° C. and reacted for 6 hours while distilling diacetone alcohol and water azeotropically.

The resulting solution was diluted with diacetone alcohol so as to achieve a solid matter concentration of 20% to obtain a solution of an imidosilane compound (vii-3) represented by the following structure.

[Formula 27]

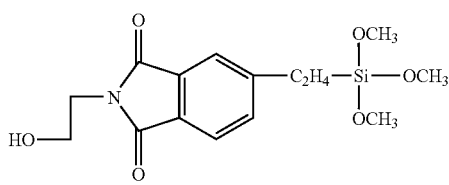

Synthesis Example 19

Synthesis of Imidosilane Compound (viii-3)

20.99 g (80 mmol) of 3-trimethoxysilylpropylsuccinic anhydride and 7.45 g (80 mmol) of aniline were added to 400 g of propylene glycol monomethyl ether, and the resulting mixture was stirred at room temperature for a while and stirred at 60° C. for further 2 hours. Thereafter, the mixture was heated up to 160° C. and reacted for 6 hours while distilling propylene glycol monomethyl ether and water azeotropically.

The resulting solution was diluted with diacetone alcohol so as to achieve a solid matter concentration of 20% to obtain a solution of an imidosilane compound (viii-3) represented by the following structure.

[Formula 28]

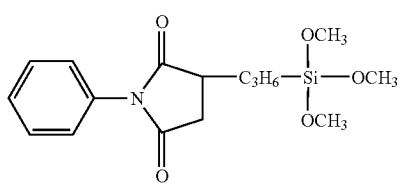

Example 1

0.333 g (8 parts by weight) of the quinone diazide compound (iv), 0.095 g (2 parts by weight) of benzyl-4-hydroxyphenylmethylsulfonium trifluoromethanesulfonate (manufactured by SANSHIN CHEMICAL INDUSTRY CO., LTD.), and 0.095 g (2 parts by weight) of "NIKALAC" MX-270 (trade name, manufactured by SANWA CHEMICAL CO., LTD.) were dissolved in 0.403 g of DAA and 2.498 g of gamma-butyrolactone (GBL) under a yellow lamp so that a weight ratio of DAA to GBL in the whole composition is 70/30, and to this, 0.476 g (2 parts by weight on the solid content equivalent basis) of the imidosilane compound (vi), 11.08 g (corresponding to 100 parts by weight of polysiloxane) of the polysiloxane solution (i), and 0.008 g (corresponding to a concentration of 50 ppm with respect to a total amount of the composition) of BYK-333 (manufactured by BYK Japan KK) which is a silicone-based surfactant were added and stirred under a yellow lamp. Then, the resulting mixture was filtered with a 0.45 μm filter to obtain a photosensitive siloxane composition. The obtained composition is taken as a composition 1.

The prepared composition 1 was applied onto a Tempax glass sheet (manufactured by Asahi Techno Glass Corp.) and a silicon wafer at an arbitrary rotating speed with a spin coater (1H-360S manufactured by MIKASA CO., LTD.), and it was pre-baked at 100° C. for 2 minutes with a hot plate (SCW-636 manufactured by Dainippon Screen Mfg. Co., Ltd.) to form a pre-baked film having a film thick of 4 μm. A g-beam+h-beam+i-beam (light having a wavelength of 350 to 450 nm) was irradiated to the prepared pre-baked film through a gray scale mask at 20 to 2000 J/m² in a maximum i-beam exposure amount using a parallel light mask aligner (hereinafter, referred to as PLA, PLA-501F manufactured by Canon Inc.). The gray scale mask is a mask through which a substance below the mask can be collectively exposed at from 1% (20 J/m²) to 100% (2000 J/m²) in incremental steps by irradiating at 2000 J/m² from above the mask.

Thereafter, the exposed film was developed by showering of ELM-D (manufactured by MITSUBISHI GAS CHEMICAL CO., INC.), which is a 2.38% by weight aqueous solution of tetramethylammoniumhydroxide, for 80 seconds using an automatic developing apparatus (AD-2000 manufactured by Takizawa Sangyo Co., Ltd.), and then rinsed with water for 30 seconds. Thereafter, as bleaching exposure, the entire surface of the film was exposed to an ultra high pressure mercury lamp at 6000 J/m² (on the exposure amount at wavelength 365 nm equivalent basis) with PLA-501F (manufactured by Canon Inc.). Thereafter, the film was soft-baked at 90° C. for 2 minutes with a hot plate (SCW-636 manufactured by Dainippon Screen Mfg. Co., Ltd.), and then is cured at 220° C. for 1 hour in the air with an oven (IHPS-222 manufactured by Tabai Espec Corp.) to prepare a cured film. The obtained cured film is taken as a cured film with a pattern. With respect to Examples 1 to 8, the compositions are shown in Table 1 and the results of evaluations are shown in Table 2. The evaluations in the table were performed according to the following methods. The following items (1), (2), (3), (4) (5) and (8) were evaluated using the silicon wafer as the substrate, and items (6) and (7) were evaluated using the Tempax glass sheet.

(1) Measurement of Film Thickness

RamdaA STM-602 manufactured by Dainippon Screen Mfg. Co., Ltd. was used to measure the thickness of a pre-baked film and a cured film at a refractive index of 1.50.

(2) Normalized Remaining Film Thickness

The normalized remaining film thickness is calculated from the following equation when the composition is applied onto a silicon wafer, pre-baked for 120 seconds on a hot plate of 100° C. and developed, and a film thickness after pre-baking is denoted by (I) and a film thickness of non-exposed area after development is denoted by (II).

Normalized remaining film thickness (%)=(II)/(I)×100

(3) Sensitivity

After the exposure and the development, the exposure amount (hereinafter, referred to as an optimum exposure amount) at which a 10 μm line and space pattern is formed at a width ratio of 1:1 is identified as the sensitivity.

(4) Resolution

A minimum pattern size obtained after development at the optimum exposure amount was taken as a resolution after development and a minimum pattern size after curing was taken as a resolution after curing.

(5) Shrinkage During Curing

The Shrinkage during curing is calculated from the following equation when the composition is applied onto a silicon wafer, pre-baked for 120 seconds on a hot plate of 100° C. and developed, and the film is subjected to bleaching exposure of 6000 J/m$^2$, soft-baking at 90° C. for 2 minutes and curing at 220° C. for one hour to obtain a cured film, and a film thickness of non-exposed area after development is denoted by (I) and a film thickness of non-exposed area after curing is denoted by (II).

Normalized remaining film thickness (%)={1−(II)/(I)}×100

(6) Measurement of Light Transmittance

First, the ultraviolet and visible absorption spectrum of the Tempax glass sheet alone was measured as a reference with MultiSpec-1500 (manufactured by Shimadzu Corp.). Next, each pre-baked film formed on the Tempax glass sheet as described above was developed by showering at 23° C. for 60 seconds with a 2.38% by weight aqueous solution of tetramethylammonium and light was irradiated to the pre-baked film at 6000 J/m$^2$ on the i-beam equivalent basis with the PLA (PLA-501F manufactured by Canon Inc.). The exposed film was soft-baked at 90° C. for 2 minutes on a hot plate and further cured at 220° C. for 1 hour in an oven to form a cured film on a glass sheet. This was taken as a sample, and the sample was measured with a single beam to determine the light transmittance per 3 μm at a wavelength of 400 nm. The transmittance of the cured film was calculated based on the measurement of the reference.

(7) Evaluation of Adhesiveness

The composition was applied onto the Tempax glass sheet, pre-baked, exposed, and cured to form a thin film. Adhesiveness was measured according to JIS K 5400 8.5.2 (1990) Cross-cut test method. Two sets, which are perpendicular to each other, of 11 parallel lines spaced 1 mm apart were inscribed in such a way that these lines reached a base of the glass sheet on the surface of the thin film on the Tempax glass sheet with a cutter to prepare 100 squares having a size of 1 mm×1 mm. A cellophane adhesive tape (width: 18 mm, adhesive force: 3.7 N/10 mm) was stuck to the surface of the thin film inscribed, and this tape was scrubbed with an eraser (passing JIS S 6050) to make the tape cohere, and then the tape was peeled off momentarily by manually pulling at one end of the tape. The number of squares remaining is then visually counted.

(8) Solvent Resistance

The cured film with a pattern formed on the silicon wafer was immersed in a solution composed of monoethanolamine and dimethylsulfoxide in proportions of 70:30 by weight at 80° C. for 10 minutes and rinsed with pure water for 5 minutes and water was removed by nitrogen gas blow. On four edge portions (within a 1-μm radius of the apex of each corner) of a trimming 40 μm square pattern, the presence or absence of the crack generated before and after immersion was visually observed using RamdaA STM-602 (manufactured by Dainippon Screen Mfg. Co., Ltd.), and total number of cracks identified at four edge portions was employed as a measure of the solvent resistance.

Example 2

A composition 2 was prepared in the same manner as in Example 1 except that the polysiloxane solution (ii) was used in place of the polysiloxane solution (i), 10 parts by weight of the quinone diazide compound (iv) was used, the imidosilane compound (vii) was used in place of the imidosilane compound (vi), and benzyl-4-hydroxyphenylmethylsulfonium trifluoromethanesulfonate and "NIKALAC" MX-270 were not used. The results of evaluations are shown in Table 2.

Example 3

A composition 3 was prepared in the same manner as in Example 1 except that the polysiloxane solution (iii), which was formed by copolymerizing the silica particle PL-2L-DAA by 27.5 mol % in terms of a silicon atom, was used in place of the polysiloxane solution (i), 4 parts by weight of the quinone diazide compound (iv) was used, 8 parts by weight of the imidosilane compound (viii) was used in place of 2 parts by weight of the imidosilane compound (vi), and benzyl-4-hydroxyphenylmethylsulfonium trifluoromethanesulfonate and "NIKALAC" MX-270 were not used. The results of evaluations are shown in Table 2.

Example 4

A composition 4 was prepared in the same manner as in Example 1 except that the Quartron PL-2L-DAA (manufactured by FUSO CHEMICAL CO., LTD.: solid content 26.4% by weight), being a dispersion of silica particle in an DAA solvent, was added to the polysiloxane solution (i) so as to achieve 27.5 mol % in terms of a silicon atom, 8 parts by weight of the quinone diazide compound (v) was used, 9 parts by weight of the imidosilane compound (ix) was used in place of 2 parts by weight of the imidosilane compound (vi), and "NIKALAC" MX-270 was not used. The results of evaluations are shown in Table 2.

Example 5

A composition 5 was prepared in the same manner as in Example 2 except that the quinone diazide compound (v) was used in place of the quinone diazide compound (iv) and 2 parts by weight of the imidosilane compound (vii) was changed to 0.5 parts by weight of the imidosilane compound (vi). The results of evaluations are shown in Table 2.

Example 6

A composition 6 was prepared in the same manner as in Example 1 except that an amount of the imidosilane compound (vi) was changed from 0.476 g (2 parts by weight on the solid content equivalent basis) to 2.856 g (12 parts by weight on the solid content equivalent basis). The results of evaluations are shown in Table 2.

Example 7

A composition 7 was prepared in the same manner as in Example 1 except that an amount of the imidosilane compound (vi) was changed from 0.476 g (2 parts by weight on the solid content equivalent basis) to 0.019 g (0.08 parts by weight on the solid content equivalent basis). The results of evaluations are shown in Table 2.

Example 8

For forming a passivation film, a photosensitive siloxane composition of the composition 1 was applied onto a TFT substrate having a silicon nitride film of 100 nm in thickness, and a contact hole was formed on a portion which is opposed to a common wiring of a drain electrode and forms a retention volume by the above-mentioned method of forming a cured film. A passivation film was dry-edged using this cured film as a mask to expose the drain electrode. Subsequently, on its surface, a film of ITO transparent electrode having a thickness of 130 nm was formed by a sputtering vapor deposition method, and a photoresist was applied onto the ITO transparent electrode film and a photoresist film was patterned by exposure/development based on a common photolithographic method to eliminate an unnecessary portion of the ITO by wet-etching, and then the photoresist was immersed in a solution composed of monoethanolamine and dimethylsulfoxide, being alkaline solvent, in proportions of 70:30 by weight at 80° C. for 10 minutes and rinsed with pure water for 5 minutes and water was removed by nitrogen gas blow, and thereby, an ITO pixel electrode patterned in a shape of stripes with 100 μm pitches was formed, and consequently a good device, having a good adhesiveness between a cured film of the photosensitive siloxane composition and a passivation film/ITO as well as an excellent planarization property and transparency based on low shrinkage during curing, and not generating cracks, was obtained.

Example 9

A TFT device was prepared in the same manner as in Example 8 except for using a photosensitive siloxane composition of the composition 2, and consequently the good device, having a good adhesiveness between a cured film of the photosensitive siloxane composition and a passivation film/ITO as well as an excellent planarization property and transparency based on low shrinkage during curing, and not generating cracks, was obtained.

Example 10

A TFT device was prepared in the same manner as in Example 8 except for using a photosensitive siloxane composition of the composition 3, and consequently the good device, having a good adhesiveness between a cured film of the photosensitive siloxane composition and a passivation film/ITO as well as an excellent planarization property and transparency based on low shrinkage during curing, and not generating cracks, was obtained.

Example 11

A TFT device was prepared in the same manner as in Example 8 except for using a photosensitive siloxane composition of the composition 4, and consequently the good device, having a good adhesiveness between a cured film of the photosensitive siloxane composition and a passivation film/ITO as well as an excellent planarization property and transparency based on low shrinkage during curing, and not generating cracks, was obtained.

Example 12

A TFT device was prepared in the same manner as in Example 8 except for using a photosensitive siloxane composition of the composition 5, and consequently the good device, having a good adhesiveness between a cured film of the photosensitive siloxane composition and a passivation film/ITO as well as an excellent planarization property and transparency based on low shrinkage during curing, and not generating cracks, was obtained.

Example 13

A composition 16 was prepared in the same manner as in Example 2 except that 2 parts by weight of the imidosilane compound (vii) was changed to 5 parts by weight of the imidosilane compound (vii-2). The results of evaluations are shown in Table 2.

Example 14

A composition 17 was prepared in the same manner as in Example 3 except that 8 parts by weight of the imidosilane compound (viii) was changed to 2 parts by weight of the imidosilane compound (viii-2). The results of evaluations are shown in Table 2.

Example 15

A composition 18 was prepared in the same manner as in Example 1 except that 2 parts by weight of the imidosilane compound (vi) was changed to 2 parts by weight of the imidosilane compound (vi-3). The results of evaluations are shown in Table 2.

Example 16

A composition 19 was prepared in the same manner as in Example 2 except that 2 parts by weight of the imidosilane compound (vii) was changed to 4 parts by weight of the imidosilane compound (vii-3). The results of evaluations are shown in Table 2.

Example 17

A composition 20 was prepared in the same manner as in Example 3 except that 8 parts by weight of the imidosilane compound (viii) was changed to 0.5 parts by weight of the imidosilane compound (viii-3). The results of evaluations are shown in Table 2.

Example 18

A TFT device was prepared in the same manner as in Example 8 except for using a photosensitive siloxane composition of the composition 17, and consequently the good device, having a good adhesiveness between a cured film of the photosensitive siloxane composition and a passivation film/ITO as well as an excellent planarization property and transparency based on low shrinkage during curing, and not generating cracks, was obtained.

Example 19

A TFT device was prepared in the same manner as in Example 8 except for using a photosensitive siloxane composition of the composition 18, and consequently the good device, having a good adhesiveness between a cured film of the photosensitive siloxane composition and a passivation film/ITO as well as an excellent planarization property and transparency based on low shrinkage during curing, and not generating cracks, was obtained.

Example 20

A TFT device was prepared in the same manner as in Example 8 except for using a photosensitive siloxane composition of the composition 19, and consequently the good device, having a good adhesiveness between a cured film of the photosensitive siloxane composition and a passivation film/ITO as well as an excellent planarization property and transparency based on low shrinkage during curing, and not generating cracks, was obtained.

Example 21

A TFT device was prepared in the same manner as in Example 8 except for using a photosensitive siloxane composition of the composition 20, and consequently the good device, having a good adhesiveness between a cured film of the photosensitive siloxane composition and a passivation film/ITO as well as an excellent planarization property and transparency based on low shrinkage during curing, and not generating cracks, was obtained.

Comparative Example 1

A composition 8 was prepared in the same manner as in Example 2 except for not using the imidosilane compound (vii). The results of evaluations are shown in Table 2.

Comparative Example 2

A composition 9 was prepared in the same manner as in Example 1 except that 2 parts by weight of the imidosilane compound (vi) was changed to 5 parts by weight of the aromatic bisimide oligomer (x). The results of evaluations are shown in Table 2.

Comparative Example 3

A composition 10 was prepared in the same manner as in Example 1 except that 2 parts by weight of the imidosilane compound (vi) was changed to 10 parts by weight of the silicone polyimide precursor compound (xi). The results of evaluations are shown in Table 2.

Comparative Example 4

A composition 11 was prepared in the same manner as in Example 1 except that 2 parts by weight of the imidosilane compound (vi) was changed to 1 part by weight of beta-(3,4-epoxycyclohexyl)ethyltrimethoxysilane (manufactured by Shin-Etsu Chemical Co., Ltd., trade name: KBM-303). The results of evaluations are shown in Table 2.

Comparative Example 5

2.64 g (30 parts by weight) of the quinone diazide compound (iv) and 0.88 g (10 parts by weight) of EPICOAT 828 (manufactured by Japan Epoxy Resins Co., Ltd.) were dissolved in 5.94 g of EDM under a yellow lamp. To this solution, 20.52 g (corresponding to 100 parts by weight of an acrylic resin) of the acrylic resin solution (xii) and 0.0015 g (corresponding to a concentration of 50 ppm with respect to a total amount of the composition) of BYK-333 (manufactured by BYK Japan KK) were added and stirred. Then, the resulting mixture was filtered with a 0.45 μm filter to obtain a composition. The obtained composition is taken as a composition 12.

Comparative Example 6

0.965 g (10 parts by weight) of the quinone diazide compound (iv) was dissolved in 6.58 g of HPE under a yellow lamp. To this solution, 22.44 g (corresponding to 100 parts by weight of a novolac resin portion) of the novolac resin solution (xiii) and 0.0015 g (corresponding to a concentration of 50 ppm with respect to a total amount of the composition) of BYK-333 (manufactured by BYK Japan KK) were added and stirred. Then, the resulting mixture was filtered with a 0.45 μm filter to obtain a composition. The obtained composition is taken as a composition 13.

Comparative Example 7

2.64 g (30 parts by weight) of the quinone diazide compound (iv), 0.88 g (10 parts by weight) of EPICOAT 828 (manufactured by Japan Epoxy Resins Co., Ltd.) and 0.476 g (2 parts by weight on the solid content equivalent basis) of the imidosilane compound (vi) were dissolved in 5.94 g of EDM under a yellow lamp. To this solution, 20.52 g (corresponding to 100 parts by weight of an acrylic resin) of the acrylic resin solution (xii) and 0.0015 g (corresponding to a concentration of 50 ppm with respect to a total amount of the composition) of BYK-333 (manufactured by BYK Japan KK) were added and stirred. Then, the resulting mixture was filtered with a 0.45 μm filter to obtain a composition. The obtained composition is taken as a composition 14.

Comparative Example 8

0.965 g (10 parts by weight) of the quinone diazide compound (iv) and 0.476 g (2 parts by weight on the solid content equivalent basis) of the imidosilane compound (vii) were dissolved in 6.58 g of HPE under a yellow lamp. To this solution, 22.44 g (corresponding to 100 parts by weight of a novolac resin portion) of the novolac resin solution (xiii) and 0.0015 g (corresponding to a concentration of 50 ppm with respect to a total amount of the composition) of BYK-333 (manufactured by BYK Japan KK) were added and stirred. Then, the resulting mixture was filtered with a 0.45 μm filter to obtain a composition. The obtained composition is taken as a composition 15.

Comparative Example 9

A TFT device was prepared in the same manner as in Example 8 except for using a photosensitive siloxane composition of the composition 8, but there were cracks in a cured film of the device and a defect-free good device could not be prepared.

Comparative Example 10

A TFT device was prepared in the same manner as in Example 8 except for using a photosensitive siloxane composition of the composition 9, but there were cracks in a cured film of the device and a defect-free good device could not be prepared.

Comparative Example 11

A TFT device was prepared in the same manner as in Example 8 except for using a photosensitive acrylic composition of the composition 12, but a defect-free good device could not be prepared, for example, there were problems with an adhesiveness, a planarization property and transparency and there were cracks in a cured film of the device.

Comparative Example 12

A TFT device was prepared in the same manner as in Example 8 except for using a photosensitive novolac composition of the composition 15, but a defect-free good device could not be prepared, for example, there were problems with a planarization property and transparency and there were cracks in a cured film of the device.

Comparative Example 13

A composition 21 was prepared in the same manner as in Comparative Example 7 except that 2 parts by weight of the imidosilane compound (vi) was changed to 7 parts by weight of the imidosilane compound (vi-2). The results of evaluations are shown in Table 2.

Comparative Example 14

A composition 22 was prepared in the same manner as in Comparative Example 8 except that 2 parts by weight of the imidosilane compound (vii) was changed to 0.5 parts by weight of the imidosilane compound (vii-2). The results of evaluations are shown in Table 2.

Comparative Example 15

A composition 23 was prepared in the same manner as in Comparative Example 7 except that 2 parts by weight of the imidosilane compound (vi) was changed to 2 parts by weight of the imidosilane compound (vi-3). The results of evaluations are shown in Table 2.

Comparative Example 16

A composition 24 was prepared in the same manner as in Comparative Example 8 except that 2 parts by weight of the imidosilane compound (vii) was changed to 5 parts by weight of the imidosilane compound (vii-3). The results of evaluations are shown in Table 2.

Comparative Example 17

A TFT device was prepared in the same manner as in Example 8 except for using a photosensitive novolac composition of the composition 22, but a defect-free good device could not be prepared, for example, there were problems with an adhesiveness, a planarization property and transparency and there were cracks in a cured film of the device.

Comparative Example 18

A TFT device was prepared in the same manner as in Example 8 except for using a photosensitive acrylic composition of the composition 23, but a defect-free good device could not be prepared, for example, there were problems with a planarization property and transparency and there were cracks in a cured film of the device.

TABLE 1a

| | (a) Polysiloxane | | | (b) Quinone | |
| --- | --- | --- | --- | --- | --- |
| | Resin (parts by weight) | Silica particles coupled with polysiloxane (mol % of Si atom) | Silica particles (mol % of Si atom) | diazide compound (parts by weight) | (c) Solvent (parts by weight) |
| Composition 1 | Polysiloxane solution ( ) 100 | | | (iv) 8 | DAA/GBL (70/30) 200 |
| Composition 2 | Polysiloxane solution (ii) 100 | | | (iv) 10 | DAA/GBL (70/30) 200 |
| Composition 3 | Polysiloxane solution (iii) 100 | PL-2L-DAA 27.5 | | (iv) 4 | DAA/GBL (70/30) 200 |
| Composition 4 | Polysiloxane solution (i) 86.4 | | PL-2L-DAA 27.5 | (v) 8 | DAA/GBL (70/30) 200 |
| Composition 5 | Polysiloxane solution (ii) 100 | | | (v) 10 | DAA/GBL (70/30) 200 |
| Composition 6 | Polysiloxane solution ( ) 100 | | | (iv) 8 | DAA/GBL (70/30) 200 |
| Composition 7 | Polysiloxane solution ( ) 100 | | | (iv) 8 | DAA/GBL (70/30) 200 |
| Composition 8 | Polysiloxane solution (ii) 100 | | | (iv) 10 | DAA/GBL (70/30) 200 |
| Composition 9 | Polysiloxane solution (i) 100 | | | (iv) 7 | DAA/GBL (70/30) 200 |
| Composition 10 | Polysiloxane solution (i) 100 | | | (iv) 7 | DAA/GBL (70/30) 200 |
| Composition 11 | Polysiloxane solution (i) 100 | | | (iv) 7 | DAA/GBL (70/30) 200 |
| Composition 12 | Acrylic resin solution (xii) 100 | | | (iv) 30 | EDM 200 |

TABLE 1a-continued

| | | | | | | |
|---|---|---|---|---|---|---|
| Composition 13 | Novolac resin solution (xiii) 100 | | | (v) 10 | HPE 200 | |
| Composition 14 | Acrylic resin solution (xii) 100 | | | (iv) 30 | EDM 200 | |
| Composition 15 | Novolac resin solution (xiii) 100 | | | (v) 10 | HPE 200 | |

| | Materials for improvement in adhesiveness (parts by weight) | | Thermal acid generator (parts by weight) | Sensitizer (parts by weight) | Heat crosslinking agent (parts by weight) | Surfactant (amount to whole composition) |
|---|---|---|---|---|---|---|
| | (d) Imidosilane compounds | Other materials for improvement in adhesiveness | | | | |
| Composition 1 | (vi) 2 | | BHPMT 2 | DBA 0.3 | "NIKALAC" MX-270 2 | BYK-333 50 ppm |
| Composition 2 | (vii) 2 | | | | | BYK-333 50 ppm |
| Composition 3 | (viii) 8 | | | | | BYK-333 50 ppm |
| Composition 4 | (ix) 9 | | BHPMT 2 | | | BYK-333 50 ppm |
| Composition 5 | (vi) 0.5 | | | | | BYK-333 50 ppm |
| Composition 6 | (vi) 12 | | BHPMT 2 | DBA 0.3 | "NIKALAC" MX-270 2 | BYK-333 50 ppm |
| Composition 7 | (vi) 0.08 | | BHPMT 2 | DBA 0.3 | "NIKALAC" MX-270 2 | BYK-333 50 ppm |
| Composition 8 | | | | | | BYK-333 50 ppm |
| Composition 9 | | (x) 5 | | | | BYK-333 50 ppm |
| Composition 10 | | (xi) 10 | | | | BYK-333 50 ppm |
| Composition 11 | | KBM-303 1 | | | | BYK-333 50 ppm |
| Composition 12 | | | | | "EPICOAT" 828 10 | BYK-333 50 ppm |
| Composition 13 | | | | | | BYK-333 50 ppm |
| Composition 14 | (vi) 2 | | | | | BYK-333 50 ppm |
| Composition 15 | (vii) 2 | | | | | BYK-333 50 ppm |

TABLE 1b

| | (a) Polysiloxane | | (b) Quinone diazide compound (parts by weight) | (c) Solvent (parts by weight) |
|---|---|---|---|---|
| | Resin (parts by weight) | Silica particles coupled with polysiloxane (mol % of Si atom) | Silica particles (mol % of Si atom) | | |
| Composition 16 | Polysiloxane solution (ii) 100 | | | (iv) 10 | DAA/GBL (70/30) 200 |
| Composition 17 | Polysiloxane solution (iii) 100 | PL-2L-DAA 27.5 | | (iv) 4 | DAA/GBL (70/30) 200 |
| Composition 18 | Polysiloxane solution ( ) 100 | | | (iv) 8 | DAA/GBL (70/30) 200 |
| Composition 19 | Polysiloxane solution (ii) 100 | | | (iv) 10 | DAA/GBL (70/30) 200 |
| Composition 20 | Polysiloxane solution (iii) 100 | PL-2L-DAA 27.5 | | (iv) 4 | DAA/GBL (70/30) 200 |
| Composition 21 | Acrylic resin solution (xii) 100 | | | (iv) 30 | EDM 200 |
| Composition 22 | Novolac resin solution (xiii) 100 | | | (v) 10 | HPE 200 |
| Composition 23 | Acrylic resin solution (xii) 100 | | | (iv) 30 | EDM 200 |
| Composition 24 | Novolac resin solution (xiii) 100 | | | (v) 10 | HPE 200 |

TABLE 1b-continued

| | Materials for improvement in adhesiveness (parts by weight) | | Thermal acid generator (parts by weight) | Sensitizer (parts by weight) | Heat crosslinking agent (parts by weight) | Surfactant (amount to whole composition) |
|---|---|---|---|---|---|---|
| | (d) Imidosilane compounds | Other materials for improvement in adhesiveness | | | | |
| Composition 16 | | (vii-2) 5 | | | | BYK-333 50 ppm |
| Composition 17 | | (viii-2) 2 | | | | BYK-333 50 ppm |
| Composition 18 | | (vi-3) 2 | BHPMT 2 | DBA 0.3 | "NIKALAC" MX-270 2 | BYK-333 50 ppm |
| Composition 19 | | (vii-3) 4 | | | | BYK-333 50 ppm |
| Composition 20 | | (viii-3) 0.5 | | | | BYK-333 50 ppm |
| Composition 21 | | (vi-2) 7 | | | | BYK-333 50 ppm |
| Composition 22 | | (vii-2) 0.5 | | | | BYK-333 50 ppm |
| Composition 23 | | (vi-3) 2 | | | | BYK-333 50 ppm |
| Composition 24 | | (vii-3) 5 | | | | BYK-333 50 ppm |

TABLE 2

| | Composition | Characteristics of photosensitivity | | | |
|---|---|---|---|---|---|
| | | Film thickness after pre-baking (μm) | Normalized remaining film thickness (%) | Sensitivity (J/m2) | Resolution after development (μm) |
| Example 1 | Composition 1 | 4 | 97 | 600 | 3 |
| Example 2 | Composition 2 | 4 | 99 | 700 | 3 |
| Example 3 | Composition 3 | 4 | 91 | 300 | 3 |
| Example 4 | Composition 4 | 4 | 93 | 450 | 3 |
| Example 5 | Composition 5 | 4 | 99 | 700 | 3 |
| Example 6 | Composition 6 | 4 | 92 | 300 | 3 |
| Example 7 | Composition 7 | 4 | 99 | 750 | 3 |
| Example 13 | Composition 16 | 4 | 96 | 350 | 3 |
| Example 14 | Composition 17 | 4 | 97 | 350 | 3 |
| Example 15 | Composition 18 | 4 | 98 | 300 | 3 |
| Example 16 | Composition 19 | 4 | 98 | 300 | 3 |
| Example 17 | Composition 20 | 4 | 98 | 300 | 3 |
| Comparative Example 1 | Composition 8 | 4 | 99 | 700 | 3 |
| Comparative Example 2 | Composition 9 | 4 | 98 | 750 | 3 |
| Comparative Example 3 | Composition 10 | 4 | 98 | 750 | 3 |
| Comparative Example 4 | Composition 11 | 4 | 98 | 750 | 3 |
| Comparative Example 5 | Composition 12 | 4 | 96 | 1500 | 6 |
| Comparative Example 6 | Composition 13 | 4 | 97 | 1000 | 8 |
| Comparative Example 7 | Composition 14 | 4 | 96 | 1500 | 6 |
| Comparative Example 8 | Composition 15 | 4 | 97 | 1000 | 8 |
| Comparative Example 13 | Composition 21 | 4 | 96 | 1400 | 6 |
| Comparative Example 14 | Composition 22 | 4 | 97 | 900 | 8 |
| Comparative Example 15 | Composition 23 | 4 | 96 | 1400 | 5 |
| Comparative Example 16 | Composition 24 | 4 | 97 | 900 | 5 |

TABLE 2-continued

| | Characteristics of film after curing | | | | | |
|---|---|---|---|---|---|---|
| | Film thickness after curing (μm) | Resolution after curing (μm) | Shrinkage during curing (%) | Light transmittance (%) | Adhesiveness (The number of remainings) | Solvent resistance (the number of cracks) |
| Example 1 | 3.5 | 6 | 5 | 98 | 100 | 0 |
| Example 2 | 3.8 | 6 | 5 | 96 | 100 | 0 |
| Example 3 | 3.8 | 3 | 2 | 98 | 100 | 0 |
| Example 4 | 3.8 | 5 | 2 | 98 | 100 | 0 |
| Example 5 | 3.7 | 5 | 5 | 97 | 95 | 0 |
| Example 6 | 3.5 | 10 | 4 | 97 | 100 | 0 |
| Example 7 | 3.8 | 6 | 5 | 98 | 88 | 0 |
| Example 13 | 3.8 | 6 | 5 | 97 | 100 | 0 |
| Example 14 | 3.8 | 6 | 5 | 97 | 100 | 0 |
| Example 15 | 3.5 | 5 | 5 | 97 | 100 | 0 |
| Example 16 | 3.8 | 5 | 5 | 97 | 100 | 0 |
| Example 17 | 3.8 | 5 | 5 | 97 | 100 | 0 |
| Comparative Example 1 | 3.8 | 7 | 6 | 98 | 60 | more than 10 |
| Comparative Example 2 | 3.6 | 7 | 6 | 85 | 100 | 2 |
| Comparative Example 3 | 3.6 | 6 | 10 | 96 | 100 | 0 |
| Comparative Example 4 | 3.6 | 5 | 6 | 96 | 100 | 5 |
| Comparative Example 5 | 3.7 | 6 | 15 | 89 | 80 | 2 |
| Comparative Example 6 | 3.8 | 9 | 10 | 32 | 80 | 6 |
| Comparative Example 7 | 3.7 | 6 | 12 | 89 | 100 | 2 |
| Comparative Example 8 | 3.8 | 9 | 10 | 32 | 100 | 4 |
| Comparative Example 13 | 3.7 | 6 | 12 | 90 | 100 | 2 |
| Comparative Example 14 | 3.8 | 9 | 10 | 32 | 100 | 4 |
| Comparative Example 15 | 3.7 | 5 | 12 | 90 | 100 | 0 |
| Comparative Example 16 | 3.8 | 5 | 10 | 40 | 100 | 0 |

INDUSTRIAL APPLICABILITY

The present invention can be used as a material for forming a planarization film for a thin film transistor (TFT) substrate of a liquid crystal display device, an organic EL display device or the like, an interlayer insulation film of a semiconductor device, or a core or clad material of a light waveguide.

The invention claimed is:

1. A photosensitive siloxane composition containing (a) polysiloxane, (b) a quinone diazide compound, (c) a solvent, and (d) one or more kinds of imidosilane compounds represented by general formulas (1) to (3):

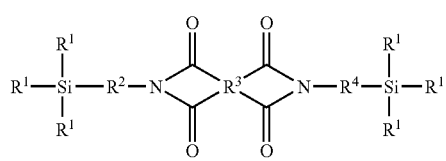

(1)

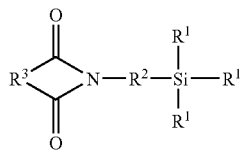

(2)

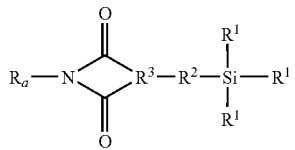

(3)

wherein $R^1$ s are the same or different and each $R^1$ represents an alkyl group having 1 to 6 carbon atoms, an alkoxy group having 1 to 6 carbon atoms, a phenyl group, a phenoxy group or an organic group with the alkyl group, the alkoxy group, the phenyl group or the phenoxy group, $R^2$ and $R^4$ represent each a divalent organic group having 1 to 10 carbon atoms, $R^3$ represents an organic group not containing a silicon atom and having 2 to 20 carbon atoms, provided that $R^3$ represents an organic group other than a phenyl group in the general formula (1) and represents an organic group, not containing an unsaturated bond, other than an alicyclic group in the general formula (2), and $R_a$ represents a hydrogen atom or an organic group not containing a silicon atom and having 1 to 20 carbon atoms.

2. The photosensitive siloxane composition according to claim 1, wherein a total amount of the one or more kinds of imidosilane compounds represented by the general formulas (1) to (3) is about 0.1 to about 10% by weight with respect to the polysiloxane.

3. The photosensitive siloxane composition according to claim 1, wherein the polysiloxane is a copolymer and contains silica particles chemically coupled with at least a portion of the polysiloxane.

4. A cured film obtained by applying and patterning the photosensitive siloxane composition according to claim 1, wherein said cured film has a light transmittance for a film thickness of 3 μm at a wavelength of 400 nm of 95% or more.

5. A device comprising the cured film according to claim 4.

* * * * *